(12) United States Patent
Schreiber et al.

(10) Patent No.: US 11,340,308 B1
(45) Date of Patent: May 24, 2022

(54) SYSTEM AND METHOD FOR STATE DETERMINATION OF A BATTERY MODULE CONFIGURED FOR USED IN AN ELECTRIC VEHICLE

(71) Applicant: BETA AIR, LLC, South Burlington, VT (US)

(72) Inventors: Stuart Denson Schreiber, Essex, VT (US); Peter Adam Gottlieb, Wayland, MA (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

(21) Appl. No.: 17/241,396

(22) Filed: Apr. 27, 2021

(51) Int. Cl.
| | |
|---|---|
| *G01R 31/392* | (2019.01) |
| *G01R 31/396* | (2019.01) |
| *B60L 58/12* | (2019.01) |
| *B60L 58/16* | (2019.01) |
| *G01R 31/382* | (2019.01) |

(52) U.S. Cl.
CPC ............ *G01R 31/392* (2019.01); *B60L 58/12* (2019.02); *B60L 58/16* (2019.02); *G01R 31/382* (2019.01); *G01R 31/396* (2019.01)

(58) Field of Classification Search
CPC .. G01R 31/392; G01R 31/382; G01R 31/396; B60L 58/12; B60L 58/16
See application file for complete search history.

(56) References Cited

U.S. PATENT DOCUMENTS

| | | | | |
|---|---|---|---|---|
| 8,855,954 B1* | 10/2014 | Bickford | ................ | G07C 3/08 |
| | | | | 702/63 |
| 9,056,556 B1* | 6/2015 | Hyde | .................... | B60L 58/20 |
| 9,079,505 B1* | 7/2015 | Hyde | ..................... | B60L 58/10 |
| 9,317,983 B2* | 4/2016 | Ricci | ..................... | G08G 1/164 |
| 9,630,517 B2 | 4/2017 | Lee | | |
| 9,643,729 B2 | 5/2017 | Walter-Robinson | | |

(Continued)

FOREIGN PATENT DOCUMENTS

| | | | | | |
|---|---|---|---|---|---|
| CN | 103745508 A | * | 4/2014 | ............ | G07C 5/08 |
| CN | 104866947 A | * | 8/2015 | ............ | G06Q 10/06 |

(Continued)

OTHER PUBLICATIONS https://dialog.proquest.com/professional/docview/2164144622?accountid=157282 Title: Unmanned aerial vehicles;Military technology Date: Dec. 1, 2018 By: Garvit Bhandari.

*Primary Examiner* — Tung S Lau
(74) *Attorney, Agent, or Firm* — Caldwell Intellectual Property Law; Keegan Caldwell; Charles Dresser

(57) ABSTRACT

A system for state determination of a battery module configured for use in an electric vehicle. The system including a battery module including at least a battery cell, a sensor including a proximity sensor configured to detect a status datum corresponding to the battery module, a processor configured to receive the status datum from the sensor, generate a charge datum as a function of the status datum corresponding to the battery module, generate a health datum as a function of the status datum corresponding to the battery module, transmit the charge datum and the health datum, and a display configured to receive the charge datum and the health datum corresponding to the battery cell, and display the charge datum and the health datum corresponding to the battery cell.

20 Claims, 8 Drawing Sheets

(56) References Cited

U.S. PATENT DOCUMENTS

| | | | |
|---|---|---|---|
| 10,300,807 B2 * | 5/2019 | Jin | G01R 31/392 |
| 10,328,805 B1 | 6/2019 | Wyrobek | |
| 10,809,309 B2 | 10/2020 | Cui | |
| 10,899,465 B2 | 1/2021 | Enke | |
| 11,106,336 B2 * | 8/2021 | Havins | B60K 35/00 |
| 2016/0009388 A1 | 1/2016 | Brotherton-Ratcliffe | |
| 2016/0349330 A1 * | 12/2016 | Barfield, Jr. | G07C 5/008 |
| 2018/0010919 A1 * | 1/2018 | Huang | H01M 50/20 |
| 2018/0099756 A1 | 4/2018 | Gore | |
| 2018/0203069 A1 | 7/2018 | Mori | |
| 2018/0370646 A1 | 12/2018 | Hon | |
| 2019/0325755 A1 * | 10/2019 | Goel | G08G 5/003 |
| 2019/0339334 A1 | 11/2019 | Mikolajczak | |
| 2020/0277063 A1 | 9/2020 | Thomassin | |
| 2020/0277081 A1 | 9/2020 | Krenz | |
| 2020/0333805 A1 | 10/2020 | English | |
| 2020/0339010 A1 | 10/2020 | Mllanueva | |

FOREIGN PATENT DOCUMENTS

| | | | | |
|---|---|---|---|---|
| CN | 105564655 A | | 5/2016 | |
| CN | 108528735 A | | 9/2018 | |
| CN | 109997050 A | * | 7/2019 | B60L 58/26 |
| CN | 112186276 A | * | 1/2021 | H02J 7/005 |
| FR | 3016218 A1 | * | 7/2015 | B60L 58/16 |
| WO | WO 2010024892 A1 | * | 3/2010 | B60L 58/16 |

* cited by examiner

SYSTEM AND METHOD FOR STATE DETERMINATION OF A BATTERY MODULE CONFIGURED FOR USED IN AN ELECTRIC VEHICLE

FIELD OF THE INVENTION

The present invention generally relates to the field of electric vehicles. In particular, the present invention is directed to a system for state determination of a battery module configured for use in an electric vehicle.

BACKGROUND

In electrically propelled vehicles, such as an electric vertical takeoff and landing (eVTOL) aircraft, it is essential to maintain the integrity of the aircraft until safe landing. In some flights, a component of the aircraft may experience a malfunction or failure which will put the aircraft in an unsafe mode which will compromise the safety of the aircraft, passengers and onboard cargo.

SUMMARY OF THE DISCLOSURE

In an aspect, a system for state determination of a battery module configured for use in an electric vehicle includes at least a battery module, the at least a battery module including at least a battery cell, at least a sensor, wherein the at least a sensor includes a proximity sensor configured to detect a status datum corresponding to the at least a battery module, a processor, the processor configured to receive the status datum from the at least a sensor, generate a charge datum as a function of the status datum corresponding to the at least a battery module, generate a health datum as a function of the status datum corresponding to the at least a battery module, transmit the charge datum and the health datum, and display, the display configured to receive the charge datum and the health datum corresponding to the at least a battery cell, and display the charge datum and the health datum corresponding to the at least a battery cell.

In another aspect, a method for state determination of a battery module configured for use in an electric vehicle includes detecting, at an at least a sensor, a status datum corresponding to at least a battery module, receiving, at a processor, the status datum corresponding to at least a battery module, generating, at the processor, a charge datum as a function of the status datum corresponding to the at least a battery module, generating, at the processor, a health datum as a function of the status datum corresponding to the at least a battery module, receiving, at a pilot display, the charge datum and the health datum, and displaying, at the pilot display, the charge datum and the health datum.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIG. 7. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply embodiments of the inventive concepts defined in the appended claims. Hence, specific dimensions and other physical characteristics relating to the embodiments disclosed herein are not to be considered as limiting, unless the claims expressly state otherwise.

Figure 1:
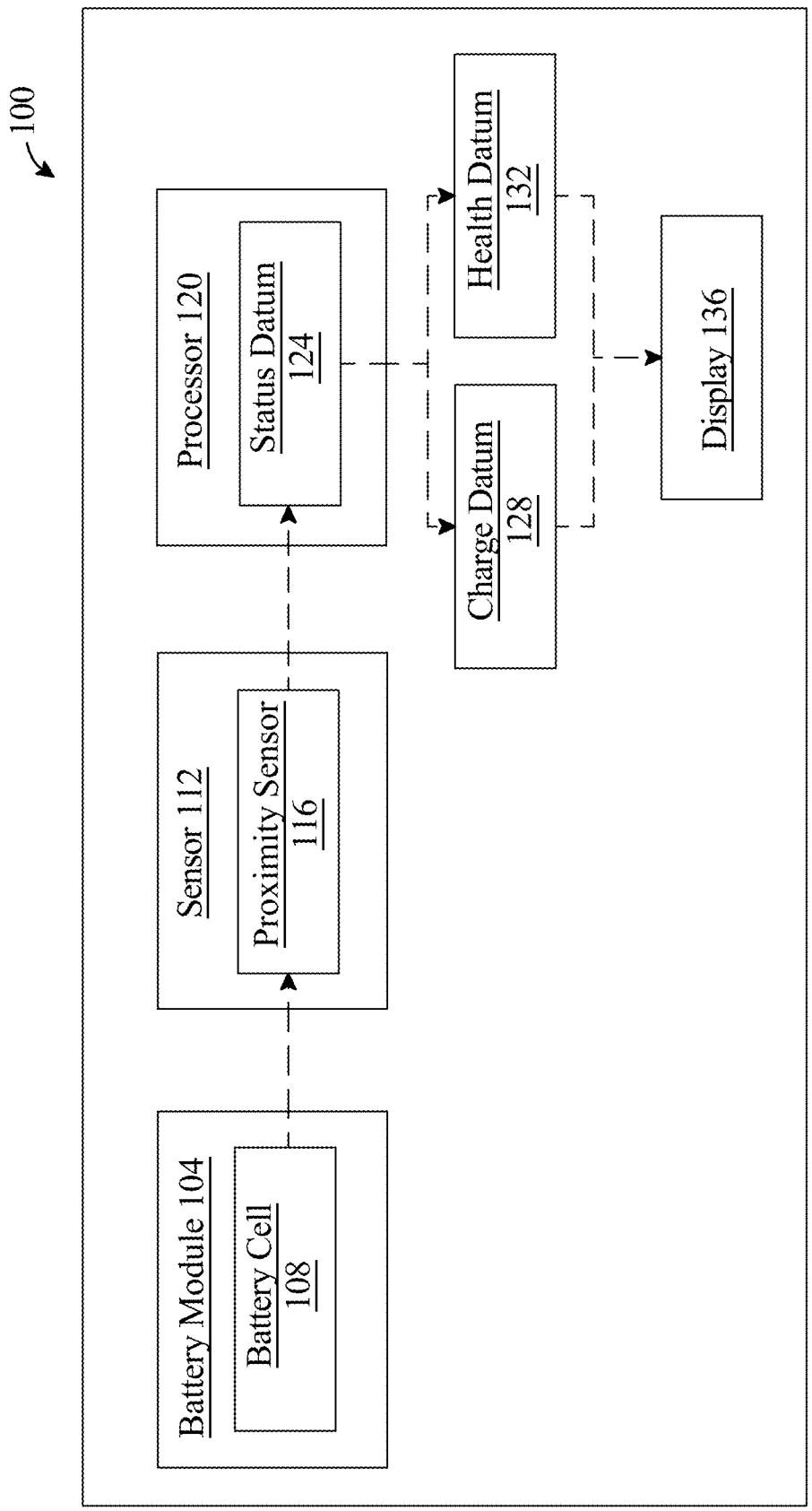
FIG. 1 is an exemplary embodiment of a system for state determination of a battery module configured for use in an electric aircraft presented in block diagram form.

Referring now to FIG. 1, an exemplary embodiment of a system 100 for state determination of a battery module configured for use in an electric vehicle is illustrated. Computing device may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. System 100 may include a single computing device operating independently, or may include two or more computing device operating in concert, in parallel, sequentially or the like; two or more computing devices may be included together in a single computing device or in two or more computing devices. System 100 may interface or communicate with one or more additional devices as described below in further detail via a network interface device. Network interface device may be utilized for connecting system 100 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. System 100 may include but is not limited to, for example, a computing device or cluster of computing devices in a first location and a second computing device or cluster of computing devices in a second location. System 100 may include one or more computing devices dedicated to data storage, security, distribution of traffic for load balancing, and the like. System 100 may distribute one or more computing tasks as described below across a plurality of computing devices of computing device, which may operate in parallel, in series, redundantly, or in any other manner used for distribution of tasks or memory between computing devices. System 100 may be implemented using a "shared nothing" architecture in which data is cached at the worker, in an embodiment, this may enable scalability of system 100 and/or computing device.

With continued reference to FIG. 1, system 100 and any one or more computing devices may be designed and/or configured to perform any method, method step, or sequence of method steps in any embodiment described in this disclosure, in any order and with any degree of repetition. For instance, system 100 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. System 100 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 100, system 100, processors, and/or controllers may be controlled by one or more Proportional-Integral-Derivative (PID) algorithms driven, for instance and without limitation by stick, rudder and/or thrust control lever with analog to digital conversion for fly by wire as described herein and related applications incorporated herein by reference. A "PID controller", for the purposes of this disclosure, is a control loop mechanism employing feedback that calculates an error value as the difference between a desired setpoint and a measured process variable and applies a correction based on proportional, integral, and derivative terms; integral and derivative terms may be generated, respectively, using analog integrators and differentiators constructed with operational amplifiers and/ or digital integrators and differentiators, as a non-limiting example. A similar philosophy to attachment of flight control systems to sticks or other manual controls via pushrods and wire may be employed except the conventional surface servos, steppers, or other electromechanical actuator components may be connected to the cockpit inceptors via electrical wires. Fly-by-wire systems may be beneficial when considering the physical size of the aircraft, utility of for fly by wire for quad lift control and may be used for remote and autonomous use, consistent with the entirety of this disclosure. System 100 may harmonize vehicle flight dynamics with best handling qualities utilizing the minimum amount of complexity whether it be additional modes, augmentation, or external sensors as described herein.

With continued reference to FIG. 1, system 100 for state determination of a battery module configured for use in an electric vehicle is presented in block diagram form. System 100 includes a battery module 104. Battery module 104 may be the same as, or similar to, any battery module as described herein, with specific reference to FIG. 5 hereinbelow. For the purposes of this disclosure, a "battery module" is an energy storage device made up of smaller individual battery storage devices connected together. For example, a battery module may be included of a plurality of battery cells wired together in series and/or parallel configured to store electrical energy. For the purposes of this disclosure, a "battery cell" is an energy storage device. For example, and without limitation, a battery cell may include an electrochemical cell configured to store potential electrical energy in the form of a chemical reaction. Any battery module and/or battery cell described herein may utilize a plurality of forms of energy storage one of ordinary skill in the art would be aware of including but not limited to, electrochemical energy storage. Battery module 104 includes at least a battery cell 108. At least a battery cell 108 may be similar to, or the same as, any battery cell as described herein, with specific reference to FIG. 3 hereinbelow. At least a battery cell 108 may be an electrochemical cell configured to store electrical energy in one or more forms and methods. At least a battery cell 108 may be configured to expand and/or contract according to one or more parameters such as time, usage, material, and configuration, among others. The configuration of an exemplary embodiment of battery module 104, at least a battery cell 108, and a portion thereof will be described in greater detail with reference to FIG. 3 and FIG. 5.

With continued reference to FIG. 1, system 100 includes at least a sensor 112. At least a sensor 112 includes a proximity sensor 116. For the purposes of this disclosure, a "proximity sensor" is a device configured to detect the distance of one or more objects from the sensor. One of ordinary skill in the art, after reviewing the entirety of this disclosure, would be aware of multiple types, implementations, and uses for a proximity sensor including measuring the distance to a sensor from an object, measuring the rate of change of distance of an object from a sensor, or triggering one or more other circuits as a function of a detection from said proximity circuit, among a plurality of others. At least a sensor 112 may be disposed in or on at least a portion of battery module 104. At least a sensor 112 may be mechanically and communicatively connected consistent with the entirety of this disclosure to one or more portions of battery module 104. Sensor 112 may include more than one proximity sensor configured to detect a distance, change in distance, threshold distance, or a combination thereof of one or more components integral to battery module 104. Proximity sensor 116 may be a sensor able to detect the presence of nearby objects without any physical contact. Proximity sensor 116 may emit an electromagnetic field or a beam of electromagnetic radiation such as infrared, for instance, and looks for changes in the field or a return signal. The object, or portion of battery module 104 or portion of battery cell 108, being sensed may be referred to as the proximity sensor 116 target. Different proximity sensor targets demand different sensors. For example, a capacitive proximity sensor or photoelectric sensor might be suitable for a plastic target; an inductive proximity sensor always requires a metal target. Proximity sensor 116 may include a capacitive proximity sensor, a capacitive proximity sensor may be based on capacitive coupling, that can detect and measure anything that is conductive or has a dielectric different from air. Proximity sensor 116 may include projected capacitive touch (PCT) technology, which is a capacitive technology which allows more accurate and flexible operation, by etching the conductive layer. An grid is formed either by etching one layer to form a grid pattern of electrodes, or by etching two separate, parallel layers of conductive material with perpendicular lines or tracks to form the grid; comparable to the pixel grid found in many liquid crystal displays (LCD). The greater resolution of PCT allows operation with no direct contact, such that the conducting layers can be coated with further protective insulating layers, and operate even under screen protectors, or behind weather and vandal-proof glass. Because the top layer of a PCT is glass, PCT is a more robust solution versus resistive touch technology. PCT may include a self-capacitance and/or mutual capacitance. For the purposes of this disclosure, "mutual capacitive" sensors have a capacitor at each intersection of each row and each column. A 12-by-16 array, for example, would have 192 independent capacitors. A voltage is applied to the rows or columns. Bringing a finger or conductive stylus near the surface of the sensor changes the local electric field which reduces the mutual capacitance. The capacitance change at every individual point on the grid can be measured to accurately determine the touch location by measuring the voltage in the other axis. Mutual capacitance allows multi-touch operation where multiple fingers, palms or styli can be accurately tracked at the same time. for the purposes of this disclosure, "self-capacitance" sensors can have the same X-Y grid as mutual capacitance sensors, but the columns and rows operate independently. With self-capacitance, current senses the capacitive load of a finger on each column or row. This produces a stronger signal than mutual capacitance sensing, but it is unable to resolve accurately more than one finger, which results in "ghosting", or misplaced location sensing. Proximity sensor 116 may have a high reliability and long functional life because of the absence of mechanical parts and lack of physical contact between the sensor and the sensed object. Proximity sensor 116 may also be used to detect machine vibration monitoring to measure the variation in distance between a shaft and its support bearing or any two or more elements included by battery module 104 and at least a battery cell 108. Proximity sensor 116 may include a photoelectric sensor. A photoelectric sensor may be a device used to determine the distance, absence, or presence of an object by using a light transmitter, often infrared and a photoelectric receiver. Proximity sensor 116 may include opposed (through-beam), retro-reflective, and proximity-sensing (diffused) types of proximity sensors. A through-beam arrangement may consists of a receiver located within the line-of-sight of the transmitter. In this mode, an object may be detected when the light beam is blocked from getting to the receiver from the transmitter. A retroreflective arrangement may place the transmitter and receiver at the same location and uses a reflector to bounce the inverted light beam back from the transmitter to the receiver. An object may be sensed when the beam is interrupted and fails to reach the receiver. A proximity-sensing (diffused) arrangement may be one in which the transmitted radiation must reflect off the object in order to reach the receiver. In this mode, an object is detected when the receiver sees the transmitted source rather than when it fails to see it. As in retro-reflective sensors, diffuse sensor emitters and receivers may be located in the same housing. But the target acts as the reflector so that detection of light is reflected off the disturbance object. The emitter may send out a beam of light (most often a pulsed infrared, visible red, or laser) that diffuses in all directions, filling a detection area. The target may then enter the area and deflects part of the beam back to the receiver. Detection occurs and output is turned on or off when sufficient light falls on the receiver. Some photo-eyes have two different operational types, light operate and dark operate. The light operates photo eyes become operational when the receiver "receives" the transmitter signal. Dark operate photo eyes become operational when the receiver "does not receive" the transmitter signal. The detecting range of a photoelectric sensor may be its "field of view", or the maximum distance from which the sensor can retrieve information, minus the minimum distance. A minimum detectable object is the smallest object the sensor can detect. More accurate sensors can often have minimum detectable objects of minuscule size. Proximity sensor 116 may include an electromagnetic induction sensor configured to use the principle of electromagnetic induction to detect or measure objects. An inductor develops a magnetic field when a current flows through it; alternatively, a current will flow through a circuit containing an inductor when the magnetic field through it changes. This effect can be used to detect metallic objects that interact with a magnetic field. Non-metallic substances such as liquids or some kinds of dirt do not interact with the magnetic field, so an inductive sensor can operate in wet or dirty conditions which may arise in or on battery module 104 and at least a battery cell 108.

With continued reference to FIG. 1, sensor 112 may include a pressure sensor. A pressure sensor may include, without limitation, a device for pressure measurement of gases or liquids. A pressure sensor may act as a transducer; it generates a signal as a function of the pressure imposed. For the purposes of this disclosure, such a signal may be electrical and consistent with the description of electrical signals herein. Pressure sensors can also be used to indirectly measure other variables such as fluid/gas flow, speed, water level, and altitude. Pressure sensors can alternatively be called pressure transducers, pressure transmitters, pressure senders, pressure indicators, piezometers and manometers, among other names. There is also a category of pressure sensors that are designed to measure in a dynamic mode for capturing very high speed changes in pressure, which may be used.

With continued reference to FIG. 1, sensor 112 may include a load cell. A load cell may be a force transducer. It may convert a force such as tension, compression, pressure, or torque into an electrical signal that can be measured and standardized. Sensor 112 may, in a load cell embodiment measure the force of one or more expanding or contracting elements included by battery module 104 and at least a battery cell 108. As the force applied to the load cell increases, the electrical signal changes proportionally. Load cell may be strain gauges, pneumatic, and hydraulic, and in non-limiting embodiments, sensor 112 may include these or other nondisclosed sensors alone or in combination.

Referring now to FIG. 1, sensor 112 may include a plurality of sensors in the form of individual sensors or a sensor suite working in tandem or individually. A sensor suite may include a plurality of independent sensors, as described herein, where any number of the described sensors may be used to detect any number of physical or electrical quantities associated with an aircraft power system or an electrical energy storage system. Independent sensors may include separate sensors measuring physical or electrical quantities that may be powered by and/or in communication with circuits independently, where each may signal sensor output to a control circuit such as a user graphical interface. In a non-limiting example, there may be four independent sensors housed in and/or on battery module 500 measuring temperature, electrical characteristic such as voltage, amperage, resistance, or impedance, proximity, or any other parameters and/or quantities as described in this disclosure. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability of system 100 and/or user to detect phenomenon is maintained and in a non-limiting example, a user alter aircraft usage pursuant to sensor readings.

With continued reference to FIG. 1, sensor 112 may include electrical sensors. Electrical sensors may be configured to measure voltage across a component, electrical current through a component, and resistance of a component. Electrical sensors may include separate sensors to measure each of the previously disclosed electrical characteristics such as voltmeter, ammeter, and ohmmeter, respectively.

With continued reference to FIG. 1, alternatively or additionally, sensor 112 may include a sensor or plurality thereof configured to detect voltage and direct the charging of individual the battery cells according to charge level; detection may be performed using any suitable component, set of components, and/or mechanism for direct or indirect measurement and/or detection of voltage levels, including without limitation comparators, analog to digital converters, any form of voltmeter, or the like. Sensor 112 and/or a control circuit incorporated therein and/or communicatively connected thereto may be configured to adjust charge to one or more the battery cells as a function of a charge level and/or a detected parameter. For instance, and without limitation, sensor 112 may be configured to determine that a charge level of a battery cell is high based on a detected voltage level of that battery cell or portion of the battery pack. Sensor 112 may alternatively or additionally detect a charge reduction event, defined for purposes of this disclosure as any temporary or permanent state of a battery cell requiring reduction or cessation of charging; a charge reduction event may include a cell being fully charged and/or a cell undergoing a physical and/or electrical process that makes continued charging at a current voltage and/or current level inadvisable due to a risk that the cell will be damaged, will overheat, or the like. Detection of a charge reduction event may include detection of a temperature, of the cell above a threshold level, detection of a voltage and/or resistance level above or below a threshold, or the like. Sensor 112 may include digital sensors, analog sensors, or a combination thereof. Sensor 112 may include digital-to-analog converters (DAC), analog-to-digital converters (ADC, A/D, A-to-D), a combination thereof, or other signal conditioning components used in transmission of a first plurality of battery pack data to a destination over wireless or wired connection.

With continued reference to FIG. 1, sensor 112 may include thermocouples, thermistors, thermometers, passive infrared sensors, resistance temperature sensors (RTD's), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor 112, may be measured in Fahrenheit (° F.), Celsius (° C.), Kelvin (° K), or another scale alone or in combination. The temperature measured by sensors may include electrical signals which are transmitted to their appropriate destination wireless or through a wired connection.

With continued reference to FIG. 1, sensor 112 may include a sensor configured to detect gas that may be emitted during or after a cell failure. "Cell failure", for the purposes of this disclosure, refers to a malfunction of a battery cell, which may be an electrochemical cell, that renders the cell inoperable for its designed function, namely providing electrical energy to at least a portion of an electric aircraft. Byproducts of cell failure may include gaseous discharge including oxygen, hydrogen, carbon dioxide, methane, carbon monoxide, a combination thereof, or another undisclosed gas, alone or in combination. Further the sensor configured to detect vent gas from electrochemical cells may include a gas detector. For the purposes of this disclosure, a "gas detector" is a device used to detect a gas is present in an area. Gas detectors, and more specifically, the gas sensor that may be used in sensor 112, may be configured to detect combustible, flammable, toxic, oxygen depleted, a combination thereof, or another type of gas alone or in combination. The gas sensor that may be present in sensor 112 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor 112 may include sensors that are configured to detect non-gaseous byproducts of cell failure including, in non-limiting examples, liquid chemical leaks including aqueous alkaline solution, ionomer, molten phosphoric acid, liquid electrolytes with redox shuttle and ionomer, and salt water, among others. Sensor 112 may include sensors that are configured to detect non-gaseous byproducts of cell failure including, in non-limiting examples, electrical anomalies as detected by any of the previous disclosed sensors or components.

With continued reference to FIG. 1, sensor 112 may be configured to detect events where voltage nears an upper voltage threshold or lower voltage threshold. The upper voltage threshold may be stored in data storage system for comparison with an instant measurement taken by any combination of sensors present within sensor 112. The upper voltage threshold may be calculated and calibrated based on factors relating to battery cell health, maintenance history, location within battery pack, designed application, and type, among others. Sensor 112 may measure voltage at an instant, over a period of time, or periodically. Sensor 112 may be configured to operate at any of these detection modes, switch between modes, or simultaneous measure in more than one mode. First battery management component may detect through sensor 112 events where voltage nears the lower voltage threshold. The lower voltage threshold may indicate power loss to or from an individual battery cell or portion of the battery pack. First battery management component may detect through sensor 112 events where voltage exceeds the upper and lower voltage threshold. Events where voltage exceeds the upper and lower voltage threshold may indicate battery cell failure or electrical anomalies that could lead to potentially dangerous situations for aircraft and personnel that may be present in or near its operation.

With continued reference to FIG. 1, one or more sensors including sensor 112 may be communicatively connected to at least a pilot control, the manipulation of which, may constitute at least an aircraft command. "Communicative connecting", for the purposes of this disclosure, refers to two or more components electrically, or otherwise connected and configured to transmit and receive signals from one another. Signals may include electrical, electromagnetic, visual, audio, radio waves, or another undisclosed signal type alone or in combination. Any datum or signal herein may include an electrical signal. Electrical signals may include analog signals, digital signals, periodic or aperiodic signal, step signals, unit impulse signal, unit ramp signal, unit parabolic signal, signum function, exponential signal, rectangular signal, triangular signal, sinusoidal signal, sinc function, or pulse width modulated signal. At least a sensor may include circuitry, computing devices, electronic components or a combination thereof that translates input datum into at least an electronic signal configured to be transmitted to another electronic component. At least a sensor communicatively connected to at least a pilot control may include a sensor disposed on, near, around or within at least pilot control. At least a sensor may include an acoustic sensor including a microphone, piezoelectric sensor, diaphragm, or other acoustic sensors alone or in combination, for example and without limitation. At least a sensor may include a motion sensor. "Motion sensor", for the purposes of this disclosure refers to a device or component configured to detect physical movement of an object or grouping of objects. One of ordinary skill in the art would appreciate, after reviewing the entirety of this disclosure, that motion may include a plurality of types including but not limited to: spinning, rotating, oscillating, gyrating, jumping, sliding, reciprocating, or the like. At least a sensor may include, torque sensor, gyroscope, accelerometer, torque sensor, magnetometer, inertial measurement unit (IMU), pressure sensor, force sensor, proximity sensor, displacement sensor, vibration sensor, among others. At least a sensor may include a sensor suite which may include a plurality of sensors that may detect similar or unique phenomena. For example, in a non-limiting embodiment, sensor suite may include a plurality of accelerometers, a mixture of accelerometers and gyroscopes, or a mixture of an accelerometer, gyroscope, and torque sensor.

With continued reference to FIG. 1, any of the sensors described herein may be included within a sense board, wherein the sense board may include sensors configured to measure physical and/or electrical parameters, such as without limitation temperature and/or voltage, of one or more the battery cells. Sense board and/or a control circuit incorporated therein and/or communicatively connected thereto, may further be configured to detect failure within each battery cell, for instance and without limitation as a function of and/or using detected physical and/or electrical parameters. Cell failure may be characterized by a spike in temperature and sense board may be configured to detect that increase and generate signals, which are discussed further below, to notify users, support personnel, safety personnel, maintainers, operators, emergency personnel, aircraft computers, or a combination thereof. Sense board may include thermocouples, thermistors, thermometers, passive infrared sensors, resistance temperature sensors (RTD's), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Heat energy is, at its core, the measure of kinetic energy of matter present within a system. Temperature, as measured by any number or combinations of sensors present on a sense board, may be measured in Fahrenheit (° F.), Celsius (° C.), Kelvin (° K), or another scale alone or in combination. The temperature measured by sensors may include electrical signals which are transmitted to their appropriate destination wireless or through a wired connection.

Further referring to FIG. 1, alternatively or additionally, and with continued reference to FIG. 1, a sense board may detect voltage and direct the charging of individual the battery cells according to charge level; detection may be performed using any suitable component, set of components, and/or mechanism for direct or indirect measurement and/or detection of voltage levels, including without limitation comparators, analog to digital converters, any form of voltmeter, or the like.

Further referring to FIG. 1, system 100 may include one or more computing devices such as a sense board and/or a control circuit incorporated therein and/or communicatively connected thereto may be configured to adjust charge to at least one battery cell of the plurality of the battery cells as a function of the detected parameter; this may include adjustment in charge as a function of detection of a charge reduction event. Alternatively or additionally, sense board and/or a control circuit incorporated therein and/or communicatively connected thereto may be configured to increase charge to a cell upon detection that a charge reduction event has ceased; for instance, sense board and/or a control circuit incorporated therein and/or communicatively connected thereto may detect that a temperature of a subject battery cell has dropped below a threshold, and may increase charge again. Charge may be regulate using any suitable means for regulation of voltage and/or current, including without limitation use of a voltage and/or current regulating component, including one that may be electrically controlled such as a transistor; transistors may include without limitation bipolar junction transistors (BJTs), field effect transistors (FETs), metal oxide field semiconductor field effect transistors (MOSFETs), and/or any other suitable transistor or similar semiconductor element. Voltage and/or current to one or more cells may alternatively or additionally be controlled by thermistor in parallel with a cell that reduces its resistance when a temperature of the cell increases, causing voltage across the cell to drop, and/or by a current shunt or other device that dissipates electrical power, for instance through a resistor.

Still referring to FIG. 1, system 100 may include a high current busbar and integral electrical connections. System 100 may charge individual the battery cells depending on battery cell charge levels. Charging may be balanced throughout the plurality of the battery cells by directing energy through balance resistors by dissipating current through resistors as heat. In this manner, the battery cells may be charged evenly, for example, cells with a lower amount of electrical energy will charge more than the battery cells with a greater amount of energy. Cell charge balancing may be controlled via any means described above for regulation of charge levels, including without limitation metal oxide silicon field effect transistor or a metal oxide semiconductor field effect transistor (MOSFET).

With continued reference to FIG. 1, outputs from any sensors or any other component present within system may be analog or digital. Onboard or remotely located processors can convert those output signals from the sensor suite to a usable form by the destination of those signals. The usable form of output signals from sensors, through processor may be either digital, analog, a combination thereof or an otherwise unstated form. Processing may be configured to trim, offset, or otherwise compensate the outputs of sensor suite. Based on sensor output, the processor can determine the output to send to downstream component. Processor can include signal amplification, operational amplifier (OpAmp), filter, digital/analog conversion, linearization circuit, current-voltage change circuits, resistance change circuits such as Wheatstone Bridge, an error compensator circuit, a combination thereof or otherwise undisclosed components. Any signal as described herein may be manipulated by one or more computing devices or components thereof. An integrator may include an operational amplifier configured to perform a mathematical operation of integration of a signal; output voltage may be proportional to input voltage integrated over time. An input current may be offset by a negative feedback current flowing in the capacitor, which may be generated by an increase in output voltage of the amplifier. The output voltage may be therefore dependent on the value of input current it has to offset and the inverse of the value of the feedback capacitor. The greater the capacitor value, the less output voltage has to be generated to produce a particular feedback current flow. The input impedance of the circuit may be almost zero because of the Miller effect. Hence all the stray capacitances (the cable capacitance, the amplifier input capacitance, etc.) are virtually grounded and they have no influence on the output signal. An operational amplifier as used in an integrator may be used as part of a positive or negative feedback amplifier or as an adder or subtractor type circuit using just pure resistances in both the input and the feedback loop. As its name implies, the Op-amp Integrator is an operational amplifier circuit that causes the output to respond to changes in the input voltage over time as the op-amp produces an output voltage which may be proportional to the integral of the input voltage. In other words, the magnitude of the output signal may be determined by the length of time a voltage may be present at its input as the current through the feedback loop charges or discharges the capacitor as the required negative feedback occurs through the capacitor. Input voltage may be Vin and represent the input signal to processor such as one or more of input datum and/or attitude error. Output voltage Vout may represent output voltage such as one or more outputs like rate setpoint. When a step voltage, Vin may be firstly applied to the input of an integrating amplifier, the uncharged capacitor C has very little resistance and acts a bit like a short circuit allowing maximum current to flow via the input resistor, Rin as potential difference exists between the two plates. No current flows into the amplifiers input and point X may be a virtual earth resulting in zero output. As the impedance of the capacitor at this point may be very low, the gain ratio of $X_C/R_{IN}$ may be also very small giving an overall voltage gain of less than one, (voltage follower circuit). As the feedback capacitor, C begins to charge up due to the influence of the input voltage, its impedance Xc slowly increase in proportion to its rate of charge. The capacitor charges up at a rate determined by the RC time constant, ($\tau$) of the series RC network. Negative feedback forces the op-amp to produce an output voltage that maintains a virtual earth at the op-amp's inverting input. Since the capacitor may be connected between the op-amp's inverting input (which may be at virtual ground potential) and the op-amp's output (which may be now negative), the potential voltage, ye developed across the capacitor slowly increases causing the charging current to decrease as the impedance of the capacitor increases. This results in the ratio of Xc/Rin increasing producing a linearly increasing ramp output voltage that continues to increase until the capacitor may be fully charged. At this point the capacitor acts as an open circuit, blocking any more flow of DC current. The ratio of feedback capacitor to input resistor ($X_C/R_{IN}$) may be now infinite resulting in infinite gain. The result of this high gain, similar to the op-amps open-loop gain, may be that the output of the amplifier goes into saturation as shown below. (Saturation occurs when the output voltage of the amplifier swings heavily to one voltage supply rail or the other with little or no control in between). The rate at which the output voltage increases (the rate of change) may be determined by the value of the resistor and the capacitor, "RC time constant". By changing this RC time constant value, either by changing the value of the Capacitor, C or the Resistor, R, the time in which it takes the output voltage to reach saturation can also be changed for example.

With continued reference to FIG. 1, sensor 112 and/or proximity sensor 116 is configured to detect a status datum 124. For the purposes of this disclosure, a "status datum" at least an element of data that represents an operating status of at least a portion of an energy storage device, namely battery module 104 and/or at least a battery cell 108. Status datum 124 may be any one or more elements of data that correspond to the health of at least a portion of battery module 104 or at least a battery cell 108. Status datum 104 may be one or more parameters associated with the health, age, electrical characteristics, physical characteristics, calculations derived therefrom, or predictions associated with the battery module 104 and/or at least a battery cell 108 according to the detected parameters, among others. Status datum 124 may include one or more elements of data corresponding to failure of at least a battery cell 108 or another portion of battery module 104. Status datum 124 may include location, type, severity, percentage, or combination of those parameters, among others, of at least a battery cell 108. Status datum 124 may include a percentage of usable battery module 104 or at least a battery cell 108 that is defective, operational, catastrophically damaged, or overheated consistent with the entirety of this disclosure. Status datum 124 may include more than one signal corresponding to the type of sensor from which is was detected. Status datum 124 may be configured to be transmitted by one or more elements of system 100 through a wired or wireless connection consistent with this disclosure to a processor 120.

With continued reference to FIG. 1, system 100 includes processor 120. Processor 120 may include one or more computing devices and/or one or more controller consistent with any of the one or more computing devices or controllers in the entirety of this disclosure. Processor 120 is configured to receive status datum 124 from the at least a sensor 112 or one or more elements communicatively connected thereto. Processor 120 may include one or more elements configured to receive an electrical signal in a wired communication or wireless communication system. Processor 120 is configured to generate a charge datum 128 as a function of status datum 124 corresponding to the battery module 104. For the purposes of this disclosure, a "charge datum" is one or more elements of data related to at least a portion of battery module 104 state of charge (SoC). For the purposes of this disclosure, "state of charge" is the level of charge of an electric battery relative to its capacity. The units of SoC may be percentage points (0%=empty; 100%=full). An alternative form of the same measure is the depth of discharge (DoD), the inverse of SoC (100%=empty; 0%=full). SoC is normally used when discussing the current state of a battery in use, while DoD is may be often seen when discussing the lifetime of the battery after repeated use. Charge datum 128 may be one or more elements of data related to the charge of a battery configured for use in an electric aircraft. In an EVTOL, for example, SoC for the battery module 104 may be the equivalent of a fuel gauge in a gasoline powered vehicle. Charge datum 128 may be calculated, adjusted, searched for in a table, retrieved from a database based on one or more detected parameters, or directly detected, among others. In embodiments, the charge datum 128 may be compared to a calculated charge datum as described with further reference to FIG. 2. For the purposes of this disclosure, a "calculated charge datum" is one or more elements of data representing the predicted state of charge of at least a portion of an energy storage device, calculated by a computing device as a function of time.

With continued reference to FIG. 1, processor 120 is configured to generate a health datum 132 as a function of status datum 124 corresponding to the at least a battery module 104. Processor 120 may be configured to generate health datum 132 as a function of status datum 124 corresponding to the at least a battery cell 108. For the purposes of this disclosure, a "health datum" includes one or more elements of data related to the state of health (SoH) of battery module 104 or at least a battery cell 108. For the purposes of this disclosure, "state of health" is a figure of merit of the condition of a battery (or a cell, or a battery pack), compared to its ideal conditions. The units of SoH are percent points (100%=the battery's conditions match the battery's specifications). Typically, a battery's SoH will be 100% at the time of manufacture and will decrease over time and use. However, a battery's performance at the time of manufacture may not meet its specifications, in which case its initial SoH will be less than 100%. In exemplary embodiments, one or more elements of system 100 including but not limited to processor 120 may evaluate state of health of the portion of battery corresponding to health datum 132. Health datum 132 may be compared to a threshold health datum corresponding to the parameter detected to generate said health datum 132. Health datum 132 may be utilized to determine, by processor 120, the suitability of battery module 104 to a given application, such as aircraft flight envelope, mission, cargo capacity, speed, maneuvers, or the like. Health datum 132 may include a useful life estimate corresponding to the at least a battery module 104. For the purposes of this disclosure, a "useful life estimate" is one or more elements of data indicating a remaining usability of one or more elements of an energy storage device, wherein the usability is a function of whether or not the one or more energy storage elements may be used in performing their designed functions. Useful life estimate may include one or more elements of data related to the remaining use of the battery module 104. Useful life estimate may include a time limit, usage limit, amperage per time parameter, electric parameter, internal resistance, impedance, conductance, capacity, voltage, self-discharge, ability to accept a charge, number of charge-discharge cycles, age of battery, temperature of battery during previous uses, current or future temperature limitations, total energy charged, total energy discharge, or predictions of failures corresponding to the battery module 104. Processor 120 may be configured to select a datum of a plurality of data and utilize the datum to determine charge datum 128 and health datum 132. Processor 120 may select data collected from one or more sensors described herein or one or more elements of data input to a system from which processor 120 may retrieve. Processor 120 may be communicatively connected to one or more databases, datastores, lists, matrices, and/or groups that represent and organize data associated with a battery module 104. Processor 120 is configured to transmit the charge datum 128 and health datum 132 to one or more other elements included by system 100 configured to receive one or more elements of data.

With continued reference to FIG. 1, any datum or data described herein, as well as any other signal or information as described herein, alone or in combination may be represented in any suitable form, including, without limitation, vectors, matrices, coefficients, scores, ranks, or other numerical comparators, and the like. A "vector" as defined in this disclosure is a data structure that represents one or more quantitative values and/or measures of forces, torques, signals, commands, or any other data structure as described in the entirety of this disclosure. A vector may be represented as an n-tuple of values, where n is at least two values, as described in further detail below; a vector may alternatively or additionally be represented as an element of a vector space, defined as a set of mathematical objects that can be added together under an operation of addition following properties of associativity, commutativity, existence of an identity element, and existence of an inverse element for each vector, and can be multiplied by scalar values under an operation of scalar multiplication compatible with field multiplication, and that has an identity element is distributive with respect to vector addition, and may be distributive with respect to field addition. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute l as derived using a Pythagorean norm:

$$l = \sqrt{\sum_{i=0}^{n} a_i^2},$$

where $a_i$ is attribute number i of the vector. Scaling and/or normalization may function to make vector comparison independent of absolute quantities of attributes, while preserving any dependency on similarity of attributes. One of ordinary skill in the art would appreciate a vector to be a mathematical value consisting of a direction and magnitude.

Electrical signals may include analog signals, digital signals, periodic or aperiodic signal, step signals, unit impulse signal, unit ramp signal, unit parabolic signal, signum function, exponential signal, rectangular signal, triangular signal, sinusoidal signal, sinc function, or pulse width modulated signal. At least a sensor may include circuitry, computing devices, electronic components or a combination thereof that translates any phenomena or combination thereof into at least a datum configured to be transmitted to any other electronic component. "Logic circuits", for the purposes of this disclosure, refer to an arrangement of electronic components such as diodes or transistors acting as electronic switches configured to act on one or more binary inputs that produce a single binary output. Logic circuits may include devices such as multiplexers, registers, arithmetic logic units (ALUs), computer memory, and microprocessors, among others. In modern practice, metal-oxide-semiconductor field-effect transistors (MOSFETs) may be implemented as logic circuit components. Communicative connecting may be performed via a bus or other facility for intercommunication between elements of a computing device. Communicative connecting may include indirect connections via "wireless" connection, low power wide area network, radio communication, optical communication, magnetic, capacitive, or optical coupling, or the like. At least pilot control may include buttons, switches, or other binary inputs in addition to, or alternatively than digital controls about which a plurality of inputs may be received.

With continued reference to FIG. 1, system 100 includes a display 136. Display 136 is configured to receive the charge datum 128 and health datum 132 corresponding to the at least a battery module 104. In non-limiting examples, display 136 may include a primary flight display (PFD), multi-function display (MFD), heads-up display (HUD), holograph, projection, gauges, audio cues, video cues, data streams, displayed in a pilot's goggles or helmet, and the like. The details of the display layout on a primary flight display can vary enormously, depending on the aircraft, the aircraft's manufacturer, the specific model of PFD, certain settings chosen by the pilot, and various internal options that are selected by the aircraft's owner (i.e., an airline, in the case of a large airliner). However, the great majority of PFDs follow a similar layout convention. The center of the PFD usually contains an attitude indicator (AI), which gives the pilot information about the aircraft's pitch and roll characteristics, and the orientation of the aircraft with respect to the horizon. Unlike a traditional attitude indicator, however, the mechanical gyroscope is not contained within the panel itself, but is rather a separate device whose information is simply displayed on the PFD. Attitude indicator is designed to look very much like traditional mechanical AIs. Other information that may or may not appear on or about the attitude indicator can include the stall angle, a runway diagram, ILS localizer and glide-path "needles", and so on. Unlike mechanical instruments, this information can be dynamically updated as required; the stall angle, for example, can be adjusted in real time to reflect the calculated critical angle of attack of the aircraft in its current configuration (airspeed, etc.). The PFD may also show an indicator of the aircraft's future path (over the next few seconds), as calculated by onboard computers, making it easier for pilots to anticipate aircraft movements and reactions. To the left and right of the attitude indicator are usually the airspeed and altitude indicators, respectively. Airspeed indicator displays the speed of the aircraft in knots, while the altitude indicator displays the aircraft's altitude above mean sea level (AMSL). These measurements are conducted through the aircraft's pitot system, which tracks air pressure measurements. As in the PFD's attitude indicator, these systems are merely displayed data from the underlying mechanical systems, and do not contain any mechanical parts (unlike an aircraft's airspeed indicator and altimeter). Both of these indicators are usually presented as vertical "tapes", which scroll up and down as altitude and airspeed change. Both indicators may often have "bugs", that is, indicators that show various important speeds and altitudes, such as V speeds calculated by a flight management system, do-not-exceed speeds for the current configuration, stall speeds, selected altitudes and airspeeds for the autopilot, and so on. At the bottom of the PFD is the heading display, which shows the pilot the magnetic heading of the aircraft. This functions much like a standard magnetic heading indicator, turning as required. Often this part of the display shows not only the current heading, but also the current track (actual path over the ground), rate of turn, current heading setting on the autopilot, and other indicators. Other information displayed on the PFD includes navigational marker information, bugs (to control the autopilot), ILS glideslope indicators, course deviation indicators, altitude indicator QFE settings, and much more. Although the layout of a PFD can be very complex, once a pilot is accustomed to it the PFD can provide an enormous amount of information with a single glance. Any of the herein described PFD layouts or components may display, in whole or in part, charge datum 128 and health datum 132.

With continued reference to FIG. 1, display 136 may include a multi-function display (MFD). An MFD may be a small-screen surrounded by configurable buttons that can be used to display information to the user in numerous configurable ways. An MFD may be configured to display any one or more elements of data including status datum 124, charge datum 128, health datum 132, or a combination thereof, among others. Display 136 may be configured to display the useful life estimate corresponding to the at least a battery module 104. Display 136 may be configured to inform one or more other systems bidirectionally connected thereto of status datum 124, charge datum 128, and/or health datum 132. For the purposes of this disclosure, "bidirectionally connected" is a communication arrangement wherein the connected systems, circuits, subsystems, computing devices, processors, chips, or any other combination of components may transmit data to and from the other. Bidirectional connection does limit the components to only two, and therefore any number of components may be connected to transmit and receive data from any and all of the other connected components. Bidirectional connection may be configured to transmit and receive one or more signals consistent with the description of any signal herein.

Figure 2:
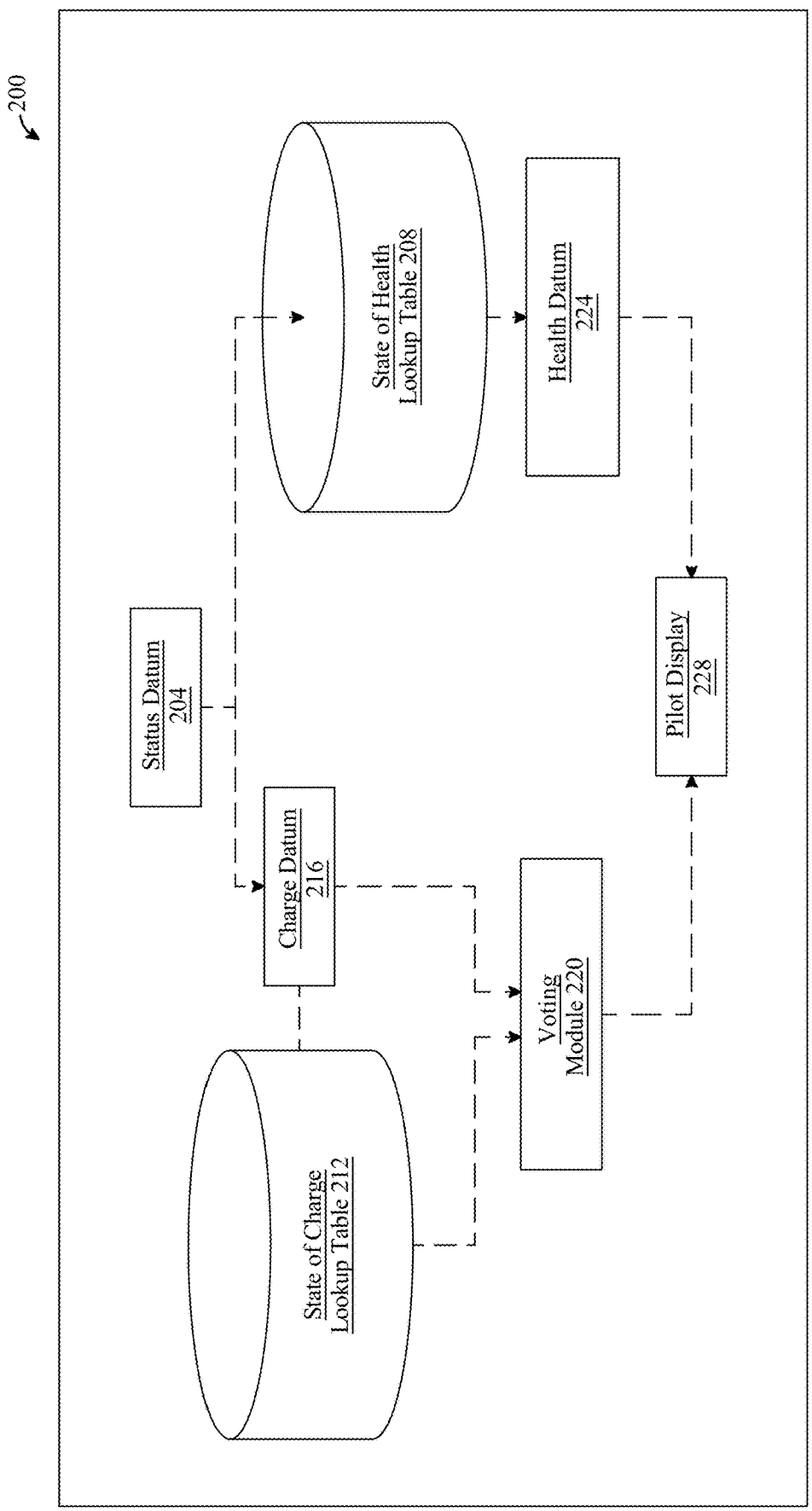
FIG. 2 is an exemplary embodiment of a processor configured to generate datums presented in block diagram form.

Referring now to FIG. 2, an exemplary embodiment of processor 200 generating a charge datum and a health datum related to a battery module. Processor 200 receives status datum 204 from at least a sensor as described herein above. Processor 200 may retrieve one or more elements of data from State of Health Lookup Table 208 that correspond to one or more elements of data represented by status datum 204. For example, and without limitation, status datum 204 may represent a distance from one or more components within an expanded battery cell, SoH Lookup Table 208 may have data and other information corresponding to that distance wherein the data represents health datum 224. Alternatively, or additionally, processor 200 may generate, calculate, or retrieve firsthand health datum 224. Additionally, processor 200 calculates charge datum 216 as a function of status datum 204 consistent with the disclosure herein. Controller 220 may retrieve one or more elements of data from State of Charge Lookup Table 212. Processor 200 may compare charge datum 216 to a retrieved one or more elements of data to verify charge datum 216 is a valid representation of state of charge of one or more elements of battery. Additionally, processor 200 may compare charge datum 216 to a calculated charge datum as defined hereinabove. A calculated charge datum may be calculated by one or more computing devices as a function of time. A calculated charge datum may include a prediction of the SoC of an ideal or other model of an energy storage system degrading at normal rates over time and use. For example and without limitation, a calculated charge datum may be generated as a function of flight hours, manufacture date, or another measurement of time of use of the energy storage system. The calculated charge datum may be retrieved from a separate or common lookup table as SoC lookup table 212, a database or suitable datastore, input by a computer or other user after calculation, a combination thereof, or another undisclosed location. Processor 200 may transmit the SoC Lookup Table 212 data value and charge datum 216 to voting module 220. Voting module 220 may determine if charge datum 216 and data retrieved from SoC Lookup Table 212 to verify charge datum is within an expected range, at an expected frequency, retrieved from an expected grouping or number of sensors or components, and verify if detected data have been detected within an expected time range, thereby verifying the data is representative of a current state of charge. Voting module 220 may ban one or more elements that do not transmit data in any of the above-mentioned expected ranges. Voting module 220 may exclude banned sensor or components data to further filter data from only trusted sources. Voting module 220 may be use a similar methodology as disclosed by U.S. patent application Ser. No. 17/218,387 filed on Mar. 31, 2021 and titled "A METHOD AND SYSTEM FOR FLY-BY-WIRE FLIGHT CONTROL CONFIGURED FOR USE IN AN ELECTRIC AIRCRAFT" which is incorporated herein by reference in its entirety. It should be noted that the voting algorithm as described in the referenced application and herein may have a predetermined or user-input thresholds for banning and unbanning components producing untrustworthy data. Processor 200 or any other computing device may perform the functions of voting module 220 for any type of sensor and any type of outputs for that data such as charge datum and/or health datum.

With continued reference to FIG. 2, processor 200 may transmit health datum 224 and the charge datum 216 as voted by voting module 220 to pilot display 228. Pilot display 228 may be consistent with the description of pilot displays hereinabove.

Figure 3:
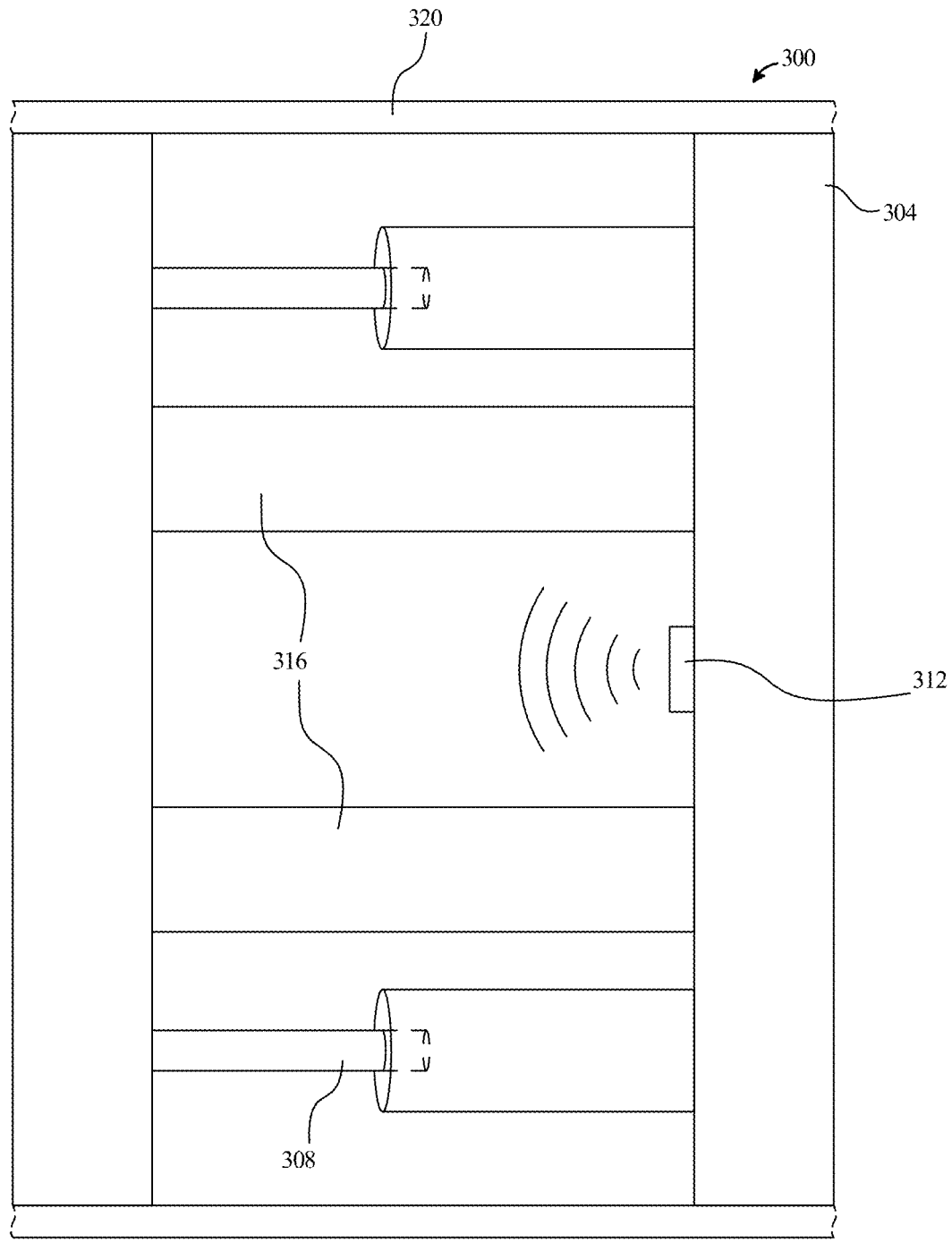
FIG. 3 is an exemplary embodiment of a portion of a battery cell configured for use in an electric aircraft presented in a section view.

Referring now to FIG. 3, portion of battery cell 300 is represented in section view. Portion of battery cell 300 is not limited to the arrangement and components represented in FIG. 3. Portion of battery cell 300 is only a segment of a full battery cell and therefore one of ordinary skill in the art would understand the dash broken lines represent extending beyond the depiction, but this segment is an exemplary embodiment of the invention. Portion of battery cell 300 includes compression element 304. Compression element 304 may be one or more structural features designed and configured to compress (i.e., move closer together) within portion of battery cell 300 with use and age. Compression element 300 may be disposed transverse to compression direction and parallel to the next proximate compression element 300. Compression element 304 may be parallel and regularly disposed between at least two endplates disposed opposite and parallel at the ends of the battery cell. Compression element 304 may be foam, composite, various thermoplastics, corrugated metals, non-conductive or semi-conductive material, or a combination thereof. Compression element 304 may include one or more materials not disclosed herein and is not limited to the embodiments shown and described. Portion of battery cell 300 includes compression alignment guide 308. For the purposes of this disclosure, a "compression alignment guide" is a feature or set of features that mate with one another on opposing compression elements configured to hold the one or more elements of a battery cell in relative alignment during compression and/or expansion of the battery cell. In a non-limiting embodiment, compression alignment guide 308 may include a pin portion disposed perpendicular to a first compression element, and a receptable disposed perpendicular to a second and proximate compression element and parallel and coincident with pin portion. Pin portion may be captured wholly or partly by the receptable. As portion of battery cell 300 compresses, and compression element 304 get closer together, compression alignment guide 308 serve as to hold compression alignment guide 308 perpendicular to the next as they compress. In this way compression alignment guide 308 prevents tilted or otherwise uneven compression and therefore extends the life of battery cell by ensuring the longest duration of compression possible.

With continued reference to FIG. 3, portion of battery cell 300 includes at least a sensor 312 as described hereinabove. At least a sensor 312 may be a proximity sensor as described herein and detect the distance between a compression element proximate to the compression element to which the at least a sensor 312 is mechanically connected. As described herein, proximity sensor may detect a threshold distance, a change in distance, or combination thereof consistent with the entirety of this disclosure. Portion of battery cell 300 may include expansion element 316. Expansion element 316 may include one or more materials configured to reduce compression of relative compression elements 304. Expansion element 316 may include rubber, plastic, metals and metal alloys, polymers, foams, or a combination thereof to produce an opposite and opposing force of compressing compression elements 304. Portion of battery cell 300 may include module strap 320. For the purposes of this disclosure, a "module strap" is an element of at least a battery cell configured to secure the battery cell to maintain its shape and the relative position of its constituent parts while conducting energy through it. Module strap 320 may include a bus bar. Module strap 320 may be consistent with the description of any bus bar as described herein. Module strap 320 may include one or more electrically conductive materials in one or more configurations including wires, strips, blocks, straps, strands, or the like. Module strap 320 may be configured to convey energy from one portion of battery cell 300 to another portion of battery cell 300. Module strap 32o may be configured to convey energy from one battery cell to another battery cell, from one battery module to another battery module, or a combination thereof, among others. Module strap 320 may include one or more flexible or rigid elements spanning the length of a portion of battery cell 300 configured to hold portion of battery cell 300 together from its ends as described herein. Module strap 320 may be disposed on or over at least a portion of battery module and therefore portion of battery cell 300. Module strap 320 may include nylon, neoprene, plastics, woven polymers, metals, rubbers, and the like to compress portion of battery cell 300. Module strap 320 may be disposed on a first end plate and mechanically connected thereto. Module strap 320 may be disposed on a second end plate disposed opposite and parallel to the first end plate. End plates (not depicted) may be disposed on opposite and opposing ends of a battery cell.

Figure 4:
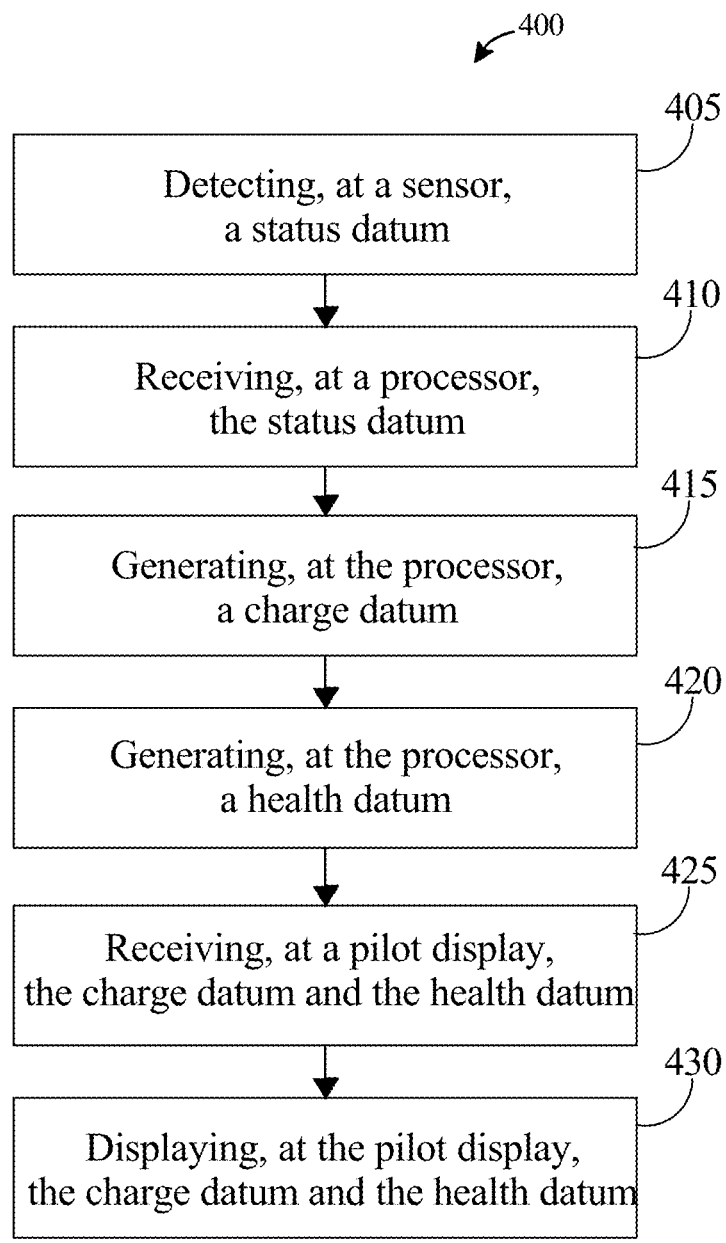
FIG. 4 is an exemplary method for state determination of a battery configured for use in an electric aircraft presented in block diagram form.

Referring now to FIG. 4, a method for state determination of a battery module configured for use in an electric vehicle includes, at 405, detecting, at an at least a sensor, a status datum corresponding to at least a battery module. Sensor may be consistent with any sensor as described herein. Sensor may include or be included by a sensor suite. The sensor may include a pressure sensor. Battery module may be consistent with any battery module as described herein. Battery module may include a module strap disposed on a first endplate and a second endplate configured to secure the first end plate and the second end plate. Battery module may include a first endplate disposed at a first end and a second endplate disposed at a second end. Battery module may include a compression alignment guide disposed between adjacent compression elements. Compression elements may be consistent with any compression element as described herein. Compression alignment guide may be consistent with any compression alignment guide as described herein.

Still referring to FIG. 4, at 410, includes receiving, at a processor, a status datum corresponding to at least a battery module. Processor may be consistent with any processor as described herein. Status datum may be consistent with any status datum as described herein. Processor may be configured to select a datum of a plurality of data and utilize the datum to determine a charge datum and a health datum. Charge datum and health datum may be consistent with any charge datum and health datum as described herein.

Still referring to FIG. 4, at 415, includes generating, at the processor, a charge datum as a function of the status datum corresponding to the at least a battery module. Charge datum may be consistent with any charge datum as described herein. Status datum may be consistent with any status datum as described herein. Processor may be consistent with any processor as described herein. Processor may be configured to compare the charge datum to a calculated charge datum. Calculated charge datum may be consistent with any comparison of charge datums as described herein.

Still referring to FIG. 4, at 420, includes generating, at the processor, a health datum as a function of the status datum corresponding to the at least a battery module. Health datum may be consistent with any health datum as described herein. Health datum may include a useful life estimate corresponding to the at least a battery module. Useful life estimate may be consistent with any useful life estimate as described herein.

Still referring to FIG. 4, at 425, includes receiving, at a pilot display, the charge datum and the health datum. Transmission of signals may be consistent with any transmission of signals as described herein. Pilot display may be consistent with any pilot display as described herein. Charge datum may be consistent with any charge datum as described herein. Health datum may be consistent with any health datum as described herein.

Still referring to FIG. 4, at 430, includes displaying, at the pilot display, the charge datum and the health datum. Pilot display may be consistent with any pilot display as described herein. Charge datum may be consistent with any charge datum as described herein. Health datum may be consistent with any health datum as described herein. Pilot display may display the useful life estimate corresponding to the at least a battery module. Useful life estimate may be consistent with any useful life estimate as described herein. Battery module may be consistent with any battery module as described herein.

Figure 5:
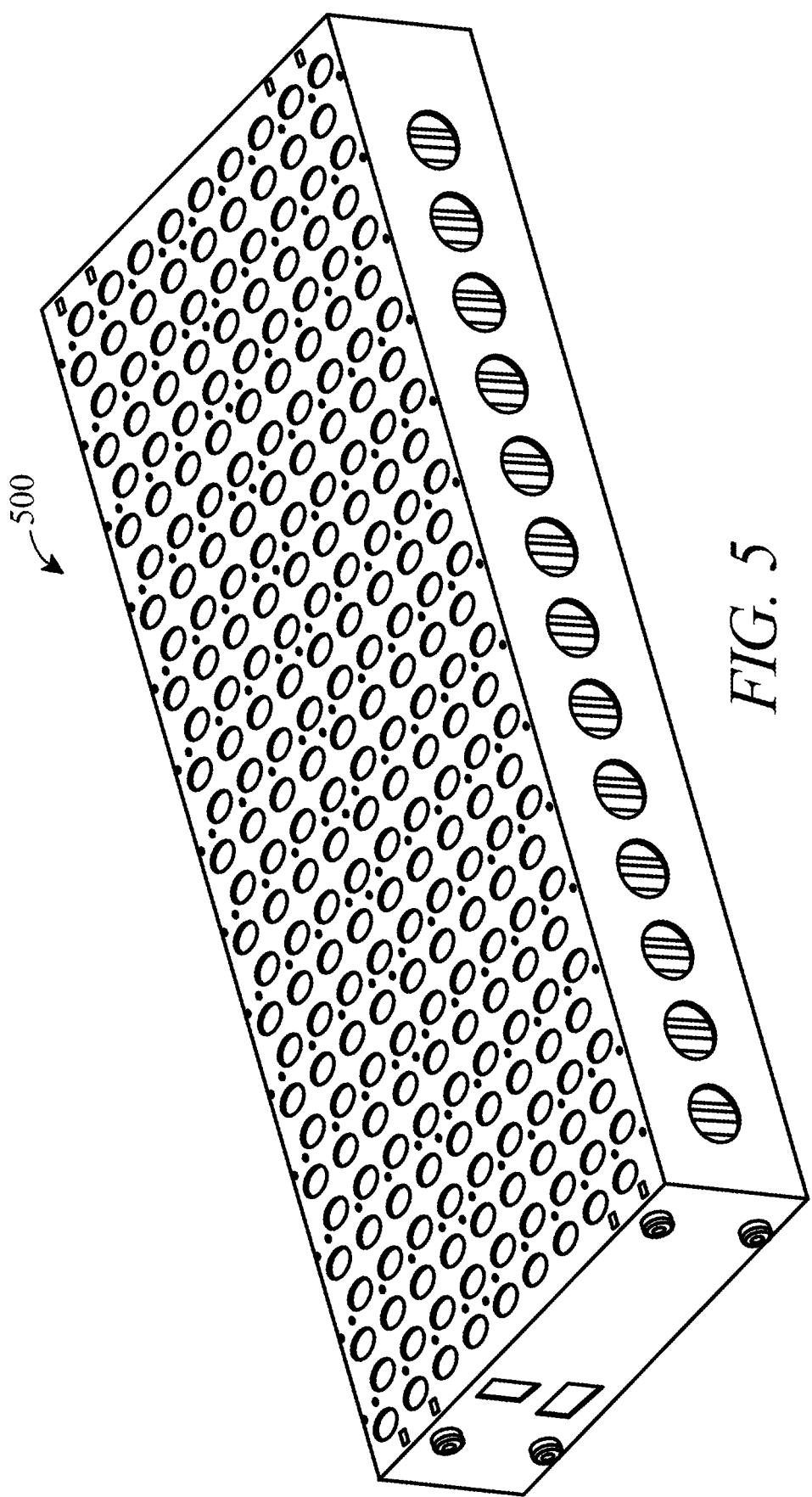
FIG. 5 is an exemplary embodiment of a battery module configured for use in electric aircraft presented in isometric view.

Referring now to FIG. 5, an exemplary embodiment of battery module 500 is illustrated. In embodiments, each circle illustrated represents a battery cell's circular cross-section. A battery cell, which will be adequately described below may take a plurality of forms, but for the purposes of these illustrations and disclosure, will be represented by a cylinder, with circles in representing the cross section of one cell each. With this orientation, a cylindrical battery cell has a long axis not visible in illustration. Battery cells are disposed in a staggered arrangement, with one battery unit including two columns of staggered cells. Each battery unit includes at least the cell retainer including a sheet of material with holes in a staggered pattern corresponding to the staggered orientation of cells. Cell retainer is the component which fixes the battery cells in their orientation amongst the entirety of the battery module. Cell retainer also includes two columns of staggered holes corresponding to the battery cells. There is the cell guide disposed between each set of two columns of the battery cells underneath the cell retainer. Battery module can include a protective wrapping which weaves in between the two columns of the battery cells contained in a battery unit.

With continued reference to FIG. 5, battery module 500 may include a sense board, a side panel, an end cap, electrical bus, and openings are presented. In an embodiment, a sense board is illustrated in its entirety. A sense board may include at least a portion of a circuit board that includes one or more sensors configured to measure the temperature of the battery cells disposed within battery module 500. In embodiments, sensor board may include one or more openings disposed in rows and column on a surface of sense board. In embodiments, each hole may correspond to the battery cells disposed within, encapsulated, at least in part, by battery units. For example, the location of each hole may correspond to the location of each battery cell disposed within battery module 500.

Referring still to FIG. 5, according to embodiment, battery module 500 can include one or more side panels. A side panel can include a protective layer of material configured to create a barrier between internal components of battery module 500 and other aircraft components or environment. A side panel may include opposite and opposing faces that form a side of and encapsulate at least a portion of battery module 500. A side panel may include metallic materials like aluminum, aluminum alloys, steel alloys, copper, tin, titanium, another undisclosed material, or a combination thereof. A side panel may not preclude use of nonmetallic materials alone or in combination with metallic components permanently or temporarily coupled together. Nonmetallic materials that may be used alone or in combination in the construction of a side panel may include high density polyethylene (HDPE), polypropylene, polycarbonate, acrylonitrile butadiene styrene, polyethylene, nylon, polystyrene, polyether ether ketone, to name a few. A side panel may be manufactured by a number of processes alone or in combination, including but limited to, machining, milling, forging, casting, 3D printing (or other additive manufacturing methods), turning, or injection molding, to name a few. One of ordinary skill in the art would appreciate that a side panel may be manufactured in pieces and assembled together by screws, nails, rivets, dowels, pins, epoxy, glue, welding, crimping, or another undisclosed method alone or in combination. A side panel may be coupled to sense board, the back plate, and/or an end cap through standard hardware like a bolt and nut mechanism, for example.

With continued reference to FIG. 5, battery module 500 may also include one or more end caps. An end cap may include a nonconductive component configured to align the back plate, sense board, and internal battery components of battery module 500 and hold their position. An end cap may form and end of and encapsulate a portion of a first end of battery module 500 and a second opposite and opposing end cap may form a second end and encapsulate a portion of a second end of battery module 500. An end cap may include a snap attachment mechanism further including a protruding boss which can configured to be captured, at least in part by a receptable of a corresponding size, by a receptacle disposed in or on the back plate. An end cap may employ a similar or same method for coupling itself to sense board, which may include a similar or the same receptacle. One or ordinary skill in the art would appreciate that the embodiments of a quick attach/detach mechanism end cap is only an example and any number of mechanisms and methods may be used for this purpose. It should also be noted that other mechanical coupling mechanisms may be used that are not necessarily designed for quick removal. Said mechanical coupling may include, as a non-limiting example, rigid coupling (e.g. beam coupling), bellows coupling, bushed pin coupling, constant velocity, split-muff coupling, diaphragm coupling, disc coupling, donut coupling, elastic coupling, flexible coupling, fluid coupling, gear coupling, grid coupling, hirth joints, hydrodynamic coupling, jaw coupling, magnetic coupling, Oldham coupling, sleeve coupling, tapered shaft lock, twin spring coupling, rag joint coupling, universal joints, or any combination thereof. An end cap may include a nonconductive component manufactured from or by a process that renders it incapable or unsuitable for conveying electrical through, on, or over it. Nonconductive materials an end cap may include may be paper, Teflon, glass, rubber, fiberglass, porcelain, ceramic, quartz, various plastics like HDPE, ABS, among others alone or in combination.

Still referring to FIG. 5, an end cap may include an electrical bus. An electrical bus, for the purposes of this disclosure and in electrical parlance is any common connection to which any number of loads, which may be connected in parallel, and share a relatively similar voltage may be electrically coupled. Electrical bus may refer to power busses, audio busses, video busses, computing address busses, and/or data busses. Electrical bus may be responsible for conveying electrical energy stored in battery module 500 to at least a portion of an eVTOL aircraft. The same or a distinct electrical bus may additionally or alternatively responsible for conveying electrical signals generated by any number of components within battery module 500 to any destination on or offboard an eVTOL aircraft. An end cap may include wiring or conductive surfaces only in portions required to electrically couple electrical bus to electrical power or necessary circuits to convey that power or signals to their destinations.

Still referring to FIG. 5, and in embodiments, a battery module with multiple battery units is illustrated, according to embodiments. Battery module 500 may include a battery cell, the cell retainer, a cell guide, a protective wrapping, a back plate, an end cap, and a side panel. Battery module 500 may include a plurality of the battery cells. In embodiments, the battery cells may be disposed and/or arranged within a respective battery unit in groupings of any number of columns and rows. For example, in the illustrative embodiment of FIG. 5, the battery cells are arranged in each respective battery unit with 18 cells in two columns. It should be noted that although the illustration may be interpreted as containing rows and columns, that the groupings of the battery cells in a battery unit, that the rows are only present as a consequence of the repetitive nature of the pattern of staggered the battery cells and battery cell holes in the cell retainer being aligned in a series. While in the illustrative embodiment of FIG. 5 the battery cells are arranged 18 to a battery unit with a plurality of battery units including battery module 500, one of skill in the art will understand that the battery cells may be arranged in any number to a row and in any number of columns and further, any number of battery units may be present in battery module 500. According to embodiments, the battery cells within a first column may be disposed and/or arranged such that they are staggered relative to the battery cells within a second column. In this way, any two adjacent rows of the battery cells may not be laterally adjacent but instead may be respectively offset a predetermined distance. In embodiments, any two adjacent rows of the battery cells may be offset by a distance equal to a radius of a battery cell. This arrangement of the battery cells is only a non-limiting example and in no way preclude other arrangement of the battery cells.

Battery module 500 may also include a protective wrapping woven between the plurality of the battery cells. Protective wrapping may provide fire protection, thermal containment, and thermal runaway during a battery cell malfunction or within normal operating limits of one or more the battery cells and/or potentially, battery module 500 as a whole. Battery module 500 may also include a backplate. A backplate is configured to provide structure and encapsulate at least a portion of the battery cells, the cell retainers, the cell guides, and protective wraps. End cap may be configured to encapsulate at least a portion of the battery cells, the cell retainers, the cell guides, and battery units, as will be discussed further below, end cap may include a protruding boss that clicks into receivers in both ends of the back plate, as well as a similar boss on a second end that clicks into sense board. Side panel may provide another structural element with two opposite and opposing faces and further configured to encapsulate at least a portion of the battery cells, the cell retainers, the cell guides, and battery units.

In embodiments, battery module 500 can include one or more the battery cells. In another embodiment, battery module 500 includes a plurality of individual the battery cells. Battery cells may each include a cell configured to include an electrochemical reaction that produces electrical energy sufficient to power at least a portion of an eVTOL aircraft. Battery cell may include electrochemical cells, galvanic cells, electrolytic cells, fuel cells, flow cells, voltaic cells, or any combination thereof—to name a few. In embodiments, the battery cells may be electrically connected in series, in parallel, or a combination of series and parallel. Series connection, as used herein, includes wiring a first terminal of a first cell to a second terminal of a second cell and further configured to include a single conductive path for electricity to flow while maintaining the same current (measured in Amperes) through any component in the circuit. Battery cells may use the term 'wired', but one of ordinary skill in the art would appreciate that this term is synonymous with 'electrically connected', and that there are many ways to couple electrical elements like the battery cells together. As an example, the battery cells can be coupled via prefabricated terminals of a first gender that mate with a second terminal with a second gender. Parallel connection, as used herein, includes wiring a first and second terminal of a first battery cell to a first and second terminal of a second battery cell and further configured to include more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in any arrangement which may confer onto the system the electrical advantages associated with that arrangement such as high-voltage applications, high-current applications, or the like. As used herein, an electrochemical cell is a device capable of generating electrical energy from chemical reactions or using electrical energy to cause chemical reactions. Further, voltaic or galvanic cells are electrochemical cells that generate electric current from chemical reactions, while electrolytic cells generate chemical reactions via electrolysis. As used herein, the term 'battery' is used as a collection of cells connected in series or parallel to each other. According to embodiments and as discussed above, any two rows of the battery cells and therefore the cell retainer openings are shifted one half-length so that no two the battery cells are directly next to the next along the length of the battery module 500, this is the staggered arrangement presented in the illustrated embodiment of FIG. 5. Cell retainer may employ this staggered arrangement to allow more cells to be disposed closer together than in square columns and rows like in a grid pattern. The staggered arrangement may also be configured to allow better thermodynamic dissipation, the methods of which may be further disclosed hereinbelow. Cell retainer may include staggered openings that align with the battery cells and further configured to hold the battery cells in fixed positions. Cell retainer may include an injection molded component. Injection molded component may include a component manufactured by injecting a liquid into a mold and letting it solidify, taking the shape of the mold in its hardened form. Cell retainer may include liquid crystal polymer, polypropylene, polycarbonate, acrylonitrile butadiene styrene, polyethylene, nylon, polystyrene, polyether ether ketone, to name a few. Cell retainer may include a second the cell retainer fixed to the second end of the battery cells and configured to hold the battery cells in place from both ends. Second cell retainer may include similar or the exact same characteristics and functions of first the cell retainer. Battery module 500 may also include the cell guide.

In embodiments, cell guide can be configured to distribute heat that may be generated by the battery cells. According to embodiments, battery module 500 may also include the back plate. Back plate is configured to provide a base structure for battery module 500 and may encapsulate at least a portion thereof. Backplate can have any shape and includes opposite, opposing sides with a thickness between them. In embodiments, the back plate may include an effectively flat, rectangular prism shaped sheet. For example, the back plate can include one side of a larger rectangular prism which characterizes the shape of battery module 500 as a whole. Back plate also includes openings correlating to each battery cell of the plurality of the battery cells. Back plate may include a lamination of multiple layers. The layers that are laminated together may include FR-4, a glass-reinforced epoxy laminate material, and a thermal barrier of a similar or exact same type as disclosed hereinabove. Back plate may be configured to provide structural support and containment of at least a portion of battery module 500 as well as provide fire and thermal protection. According to embodiments, battery module 500 may also include an end cap configured to encapsulate at least a portion of battery module 500. End cap may provide structural support for battery module 500 and hold the back plate in a fixed relative position compared to the overall battery module 500. End cap may include a protruding boss on a first end that mates up with and snaps into a receiving feature on a first end of the back plate. End cap may include a second protruding boss on a second end that mates up with and snaps into a receiving feature on the sense board. Battery module 500 may also include at least a side panel that may encapsulate two sides of battery module 500. Any side panel may include opposite and opposing faces including a metal or composite material. Side panel(s) may provide structural support for battery module 500 and provide a barrier to separate battery module 500 from exterior components within aircraft or environment.

With continued reference to FIG. 5, any of the disclosed systems, namely battery module 500 or one or more battery packs may incorporate provisions to dissipate heat energy present due to electrical resistance in integral circuit. Battery module 500 includes one or more battery element modules wired in series and/or parallel. The presence of a voltage difference and associated amperage inevitably will increase heat energy present in and around battery module 500 as a whole. The presence of heat energy in a power system is potentially dangerous by introducing energy possibly sufficient to damage mechanical, electrical, and/or other systems present in at least a portion of exemplary aircraft 00. Battery module 500 may include mechanical design elements, one of ordinary skill in the art, may thermodynamically dissipate heat energy away from battery module 500. The mechanical design may include, but is not limited to, slots, fins, heat sinks, perforations, a combination thereof, or another undisclosed element.

With continued reference to FIG. 5, heat dissipation may include material selection beneficial to move heat energy in a suitable manner for operation of battery module 500. Certain materials with specific atomic structures and therefore specific elemental or alloyed properties and characteristics may be selected in construction of battery module 500 to transfer heat energy out of a vulnerable location or selected to withstand certain levels of heat energy output that may potentially damage an otherwise unprotected component. One of ordinary skill in the art, after reading the entirety of this disclosure would understand that material selection may include titanium, steel alloys, nickel, copper, nickel-copper alloys such as Monel, tantalum and tantalum alloys, tungsten and tungsten alloys such as Inconel, a combination thereof, or another undisclosed material or combination thereof.

With continued reference to FIG. 5, heat dissipation may include a combination of mechanical design and material selection. The responsibility of heat dissipation may fall upon the material selection and design as disclosed above in regard to any component disclosed in this paper. Battery module 500 may include similar or identical features and materials ascribed to battery module 500 in order to manage the heat energy produced by these systems and components.

With continued reference to FIG. 5, according to embodiments, the circuitry battery module 500 may include, as discussed above, may be shielded from electromagnetic interference. The battery elements and associated circuitry may be shielded by material such as mylar, aluminum, copper a combination thereof, or another suitable material. Battery module 500 and associated circuitry may include one or more of the aforementioned materials in their inherent construction or additionally added after manufacture for the express purpose of shielding a vulnerable component. Battery module 500 and associated circuitry may alternatively or additionally be shielded by location. Electrochemical interference shielding by location includes a design configured to separate a potentially vulnerable component from energy that may compromise the function of said component. The location of vulnerable component may be a physical uninterrupted distance away from an interfering energy source, or location configured to include a shielding element between energy source and target component. The shielding may include an aforementioned material in this section, a mechanical design configured to dissipate the interfering energy, and/or a combination thereof. The shielding including material, location and additional shielding elements may defend a vulnerable component from one or more types of energy at a single time and instance or include separate shielding for individual potentially interfering energies.

With continued reference to FIG. 5, battery module 500 may be a portion of a battery pack, the battery pack may be a power source that is configured to store electrical energy in the form of a plurality of battery modules, which themselves are included of a plurality of electrochemical cells. These cells may utilize electrochemical cells, galvanic cells, electrolytic cells, fuel cells, flow cells, and/or voltaic cells. In general, an electrochemical cell is a device capable of generating electrical energy from chemical reactions or using electrical energy to cause chemical reactions, this disclosure will focus on the former. Voltaic or galvanic cells are electrochemical cells that generate electric current from chemical reactions, while electrolytic cells generate chemical reactions via electrolysis. In general, the term 'battery' is used as a collection of cells connected in series or parallel to each other. A battery cell may, when used in conjunction with other cells, may be electrically connected in series, in parallel or a combination of series and parallel. Series connection includes wiring a first terminal of a first cell to a second terminal of a second cell and further configured to include a single conductive path for electricity to flow while maintaining the same current (measured in Amperes) through any component in the circuit. A battery cell may use the term 'wired', but one of ordinary skill in the art would appreciate that this term is synonymous with 'electrically connected', and that there are many ways to couple electrical elements like the battery cells together. An example of a connector that do not include wires may be prefabricated terminals of a first gender that mate with a second terminal with a second gender. Battery cells may be wired in parallel. Parallel connection includes wiring a first and second terminal of a first battery cell to a first and second terminal of a second battery cell and further configured to include more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in a virtually unlimited arrangement which may confer onto the system the electrical advantages associated with that arrangement such as high-voltage applications, high-current applications, or the like. In an exemplary embodiment, the battery pack include 196 battery cells in series and 18 battery cells in parallel. This is, as someone of ordinary skill in the art would appreciate, is only an example and the battery pack may be configured to have a near limitless arrangement of battery cell configurations.

With continued reference to FIG. 5, a battery pack may include a plurality of battery modules 500. Battery modules 500 may be wired together in series and in parallel. Battery pack may include center sheet which may include a thin barrier. The barrier may include a fuse connecting battery modules on either side of center sheet. The fuse may be disposed in or on center sheet and configured to connect to an electric circuit including a first battery module and therefore battery unit and cells. In general, and for the purposes of this disclosure, a fuse is an electrical safety device that operate to provide overcurrent protection of an electrical circuit. As a sacrificial device, its essential component is metal wire or strip that melts when too much current flows through it, thereby interrupting energy flow. Fuse may include a thermal fuse, mechanical fuse, blade fuse, expulsion fuse, spark gap surge arrestor, varistor, or a combination thereof. Battery pack may also include a side wall includes a laminate of a plurality of layers configured to thermally insulate the plurality of battery modules from external components of the battery pack. Side wall layers may include materials which possess characteristics suitable for thermal insulation as described in the entirety of this disclosure like fiberglass, air, iron fibers, polystyrene foam, and thin plastic films, to name a few. Side wall may additionally or alternatively electrically insulate the plurality of battery modules from external components of the battery pack and the layers of which may include polyvinyl chloride (PVC), glass, asbestos, rigid laminate, varnish, resin, paper, Teflon, rubber, and mechanical lamina. Center sheet may be mechanically coupled to side wall in any manner described in the entirety of this disclosure or otherwise undisclosed methods, alone or in combination. Side wall may include a feature for alignment and coupling to center sheet. This feature may include a cutout, slots, holes, bosses, ridges, channels, and/or other undisclosed mechanical features, alone or in combination. Battery pack may also include the end panel including a plurality of electrical connectors and further configured to fix the battery pack in alignment with at least a side wall. End panel may include a plurality of electrical connectors of a first gender configured to electrically and mechanically couple to electrical connectors of a second gender. End panel may be configured to convey electrical energy from the battery cells to at least a portion of an eVTOL aircraft. Electrical energy may be configured to power at least a portion of an eVTOL aircraft or include signals to notify aircraft computers, personnel, users, pilots, and any others of information regarding battery health, emergencies, and/or electrical characteristics. The plurality of electrical connectors may include blind mate connectors, plug and socket connectors, screw terminals, ring and spade connectors, blade connectors, and/or an undisclosed type alone or in combination. The electrical connectors of which the end panel includes may be configured for power and communication purposes. A first end of the end panel may be configured to mechanically couple to a first end of a first side wall by a snap attachment mechanism, similar to end cap and side panel configuration utilized in the battery module. To reiterate, a protrusion disposed in or on the end panel may be captured, at least in part, by a receptacle disposed in or on side wall. A second end of the end panel may be mechanically coupled to a second end of a second side wall in a similar or the same mechanism.

Figure 6:
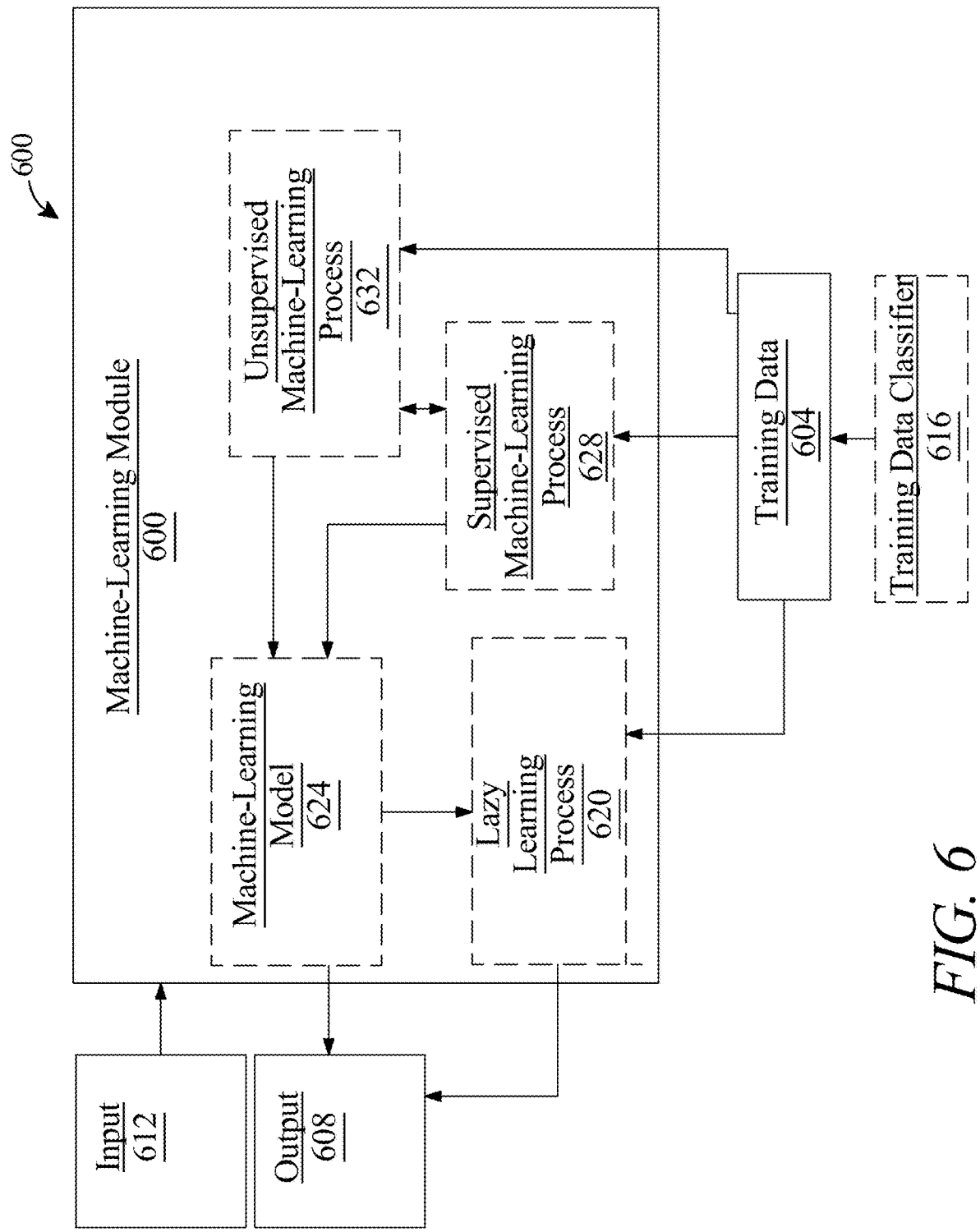
FIG. 6 is a block diagram of an exemplary embodiment of a machine learning module.

Referring now to FIG. 6, system 100, processor 200, or another computing device or model may utilize stored data to generate any datum as described herein. Stored data may be past status datums, charge datums, health datums, or the like in an embodiment of the present invention. Stored data may be input by a user, pilot, support personnel, or another. Stored data may include algorithms and machine-learning processes that may generate one or more datums associated with the herein disclosed system including charge datums, health datums, and the like. The algorithms and machine-learning processes may be any algorithm or machine-learning processes as described herein. Training data may be columns, matrices, rows, blocks, spreadsheets, books, or other suitable datastores or structures that contain correlations between past status datums, health datums, or the like to useful life estimates. Training data may be any training data as described below. Training data may be past measurements detected by any sensors described herein or another sensor or suite of sensors in combination. Training data may be detected by onboard or offboard instrumentation designed to detect status datum or environmental conditions as described herein. Training data may be uploaded, downloaded, and/or retrieved from a server prior to flight. Training data may be generated by a computing device that may simulate input datums suitable for use by the processor, flight controller, controller, or other computing devices in an embodiment of the present invention. Processor, flight controller, controller, and/or another computing device as described in this disclosure may train one or more machine-learning models using the training data as described in this disclosure. Training one or more machine-learning models consistent with the training one or more machine learning modules as described in this disclosure.

With continued reference to FIG. 6, algorithms and machine-learning processes may include any algorithms or machine-learning processes as described herein. Training data may be columns, matrices, rows, blocks, spreadsheets, books, or other suitable datastores or structures that contain correlations between torque measurements to obstruction datums. Training data may be any training data as described herein. Training data may be past measurements detected by any sensors described herein or another sensor or suite of sensors in combination. Training data may be detected by onboard or offboard instrumentation designed to detect environmental conditions and measured state datums as described herein. Training data may be uploaded, downloaded, and/or retrieved from a server prior to flight. Training data may be generated by a computing device that may simulate predictive datums, performance datums, or the like suitable for use by the processor, flight controller, controller, plant model, in an embodiment of the present invention. Processor, flight controller, controller, and/or another computing device as described in this disclosure may train one or more machine-learning models using the training data as described in this disclosure.

Still referring to FIG. 6, an exemplary embodiment of a machine-learning module 600 that may perform one or more machine-learning processes as described in this disclosure may be illustrated. Machine-learning module may perform determinations, classification, and/or analysis steps, methods, processes, or the like as described in this disclosure using machine learning processes. A "machine learning process," as used in this disclosure, may be a process that automatedly uses training data 604 to generate an algorithm that will be performed by a computing device/module to produce outputs 608 given data provided as inputs 612; this may be in contrast to a non-machine learning software program where the commands to be executed are determined in advance by a user and written in a programming language.

Still referring to FIG. 6, "training data," as used herein, may be data containing correlations that a machine-learning process may use to model relationships between two or more categories of data elements. For instance, and without limitation, training data 604 may include a plurality of data entries, each entry representing a set of data elements that were recorded, received, and/or generated together; data elements may be correlated by shared existence in a given data entry, by proximity in a given data entry, or the like. Multiple data entries in training data 604 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 604 according to various correlations; correlations may indicate causative and/or predictive links between categories of data elements, which may be modeled as relationships such as mathematical relationships by machine-learning processes as described in further detail below. Training data 604 may be formatted and/or organized by categories of data elements, for instance by associating data elements with one or more descriptors corresponding to categories of data elements. As a non-limiting example, training data 604 may include data entered in standardized forms by persons or processes, such that entry of a given data element in a given field in a form may be mapped to one or more descriptors of categories. Elements in training data 604 may be linked to descriptors of categories by tags, tokens, or other data elements; for instance, and without limitation, training data 604 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively, or additionally, and continuing to refer to FIG. 6, training data 604 may include one or more elements that are not categorized; that may be, training data 604 may not be formatted or contain descriptors for some elements of data. Machine-learning algorithms and/or other processes may sort training data 604 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 604 to be made applicable for two or more distinct machine-learning algorithms as described in further detail below. Training data 604 used by machine-learning module 600 may correlate any input data as described in this disclosure to any output data as described in this disclosure.

Further referring to FIG. 6, training data may be filtered, sorted, and/or selected using one or more supervised and/or unsupervised machine-learning processes and/or models as described in further detail below; such models may include without limitation a training data classifier 616. Training data classifier 616 may include a "classifier," which as used in this disclosure may be a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 600 may generate a classifier using a classification algorithm, defined as a processes whereby a computing device and/or any module and/or component operating thereon derives a classifier from training data 604. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 616 may classify elements of training data to classes of deficiencies, wherein a nourishment deficiency may be categorized to a large deficiency, a medium deficiency, and/or a small deficiency.

Still referring to FIG. 6, machine-learning module 600 may be configured to perform a lazy-learning process 620 and/or protocol, which may alternatively be referred to as a "lazy loading" or "call-when-needed" process and/or protocol, may be a process whereby machine learning may be conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 604. Heuristic may include selecting some number of highest-ranking associations and/or training data 604 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 6, machine-learning processes as described in this disclosure may be used to generate machine-learning models 624. A "machine-learning model," as used in this disclosure, may be a mathematical and/or algorithmic representation of a relationship between inputs and outputs, as generated using any machine-learning process including without limitation any process as described above, and stored in memory; an input is submitted to a machine-learning model 624 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 624 may be generated by creating an artificial neural network, such as a convolutional neural network including an input layer of nodes, one or more intermediate layers, and an output layer of nodes. Connections between nodes may be created via the process of "training" the network, in which elements from a training data 604 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process may be sometimes referred to as deep learning.

Still referring to FIG. 6, machine-learning algorithms may include at least a supervised machine-learning process 628. At least a supervised machine-learning process 628, as defined herein, include algorithms that receive a training set relating a number of inputs to a number of outputs, and seek to find one or more mathematical relations relating inputs to outputs, where each of the one or more mathematical relations may be optimal according to some criterion specified to the algorithm using some scoring function. For instance, a supervised learning algorithm may include status datum as described above as one or more inputs, charge or health datum as an output, and a scoring function representing a desired form of relationship to be detected between inputs and outputs; scoring function may, for instance, seek to maximize the probability that a given input and/or combination of elements inputs may be associated with a given output to minimize the probability that a given input may be not associated with a given output. Scoring function may be expressed as a risk function representing an "expected loss" of an algorithm relating inputs to outputs, where loss is computed as an error function representing a degree to which a prediction generated by the relation may be incorrect when compared to a given input-output pair provided in training data 604. Persons skilled in the art, upon reviewing the entirety of this disclosure, will be aware of various possible variations of at least a supervised machine-learning process 628 that may be used to determine relation between inputs and outputs. Supervised machine-learning processes may include classification algorithms as defined above.

Further referring to FIG. 6, machine learning processes may include at least an unsupervised machine-learning processes 632. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 6, machine-learning module 600 may be designed and configured to create a machine-learning model 624 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression may be combined with multiplying the least-squares term by a factor of 1 divided by double the number of samples. Linear regression models may include a multi-task lasso model wherein the norm applied in the least-squares term of the lasso model may be the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit may be sought; similar methods to those described above may be applied to minimize error functions, as will be apparent to persons skilled in the art upon reviewing the entirety of this disclosure.

Continuing to refer to FIG. 6, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

With continued reference to FIG. 6, an "objective function," as used in this disclosure, is a mathematical function with a solution set including a plurality of data elements to be compared. Mixer may compute a score, metric, ranking, or the like, associated with each performance prognoses and candidate transfer apparatus and select objectives to minimize and/or maximize the score/rank, depending on whether an optimal result may be represented, respectively, by a minimal and/or maximal score; an objective function may be used by mixer to score each possible pairing. At least an optimization problem may be based on one or more objectives, as described below. Mixer may pair a candidate transfer apparatus, with a given combination of performance prognoses, that optimizes the objective function. In various embodiments solving at least an optimization problem may be based on a combination of one or more factors. Each factor may be assigned a score based on predetermined variables. In some embodiments, the assigned scores may be weighted or unweighted. Solving at least an optimization problem may include performing a greedy algorithm process, where optimization may be performed by minimizing and/or maximizing an output of objective function. A "greedy algorithm" is defined as an algorithm that selects locally optimal choices, which may or may not generate a globally optimal solution. For instance, mixer may select objectives so that scores associated therewith are the best score for each goal. For instance, in non-limiting illustrative example, optimization may determine the pitch moment associated with an output of at least a propulsor based on an input.

With continued reference to FIG. 6, at least an optimization problem may be formulated as a linear objective function, which mixer may optimize using a linear program such as without limitation a mixed-integer program. A "linear program," as used in this disclosure, is a program that optimizes a linear objective function, given at least a constraint; a linear program maybe referred to without limitation as a "linear optimization" process and/or algorithm. For instance, in non-limiting illustrative examples, a given constraint might be torque limit, and a linear program may use a linear objective function to calculate maximum output based on the limit. In various embodiments, mixer may determine a set of instructions towards achieving a user's goal that maximizes a total score subject to a constraint that there are other competing objectives. A mathematical solver may be implemented to solve for the set of instructions that maximizes scores; mathematical solver may be implemented on mixer and/or another device in flight control system, and/or may be implemented on third-party solver. At least an optimization problem may be formulated as nonlinear least squares optimization process. A "nonlinear least squares optimization process," for the purposes of this disclosure, is a form of least squares analysis used to fit a set of m observations with a model that is non-linear in n unknown parameters, where m is greater than or equal to n. The basis of the method is to approximate the model by a linear one and to refine the parameters by successive iterations. A nonlinear least squares optimization process may output a fit of signals to at least a propulsor. Solving at least an optimization problem may include minimizing a loss function, where a "loss function" is an expression an output of which a ranking process minimizes to generate an optimal result. As a non-limiting example, mixer may assign variables relating to a set of parameters, which may correspond to score components as described above, calculate an output of mathematical expression using the variables, and select an objective that produces an output having the lowest size, according to a given definition of "size," of the set of outputs representing each of plurality of candidate ingredient combinations; size may, for instance, included absolute value, numerical size, or the like. Selection of different loss functions may result in identification of different potential pairings as generating minimal outputs.

Figure 7:
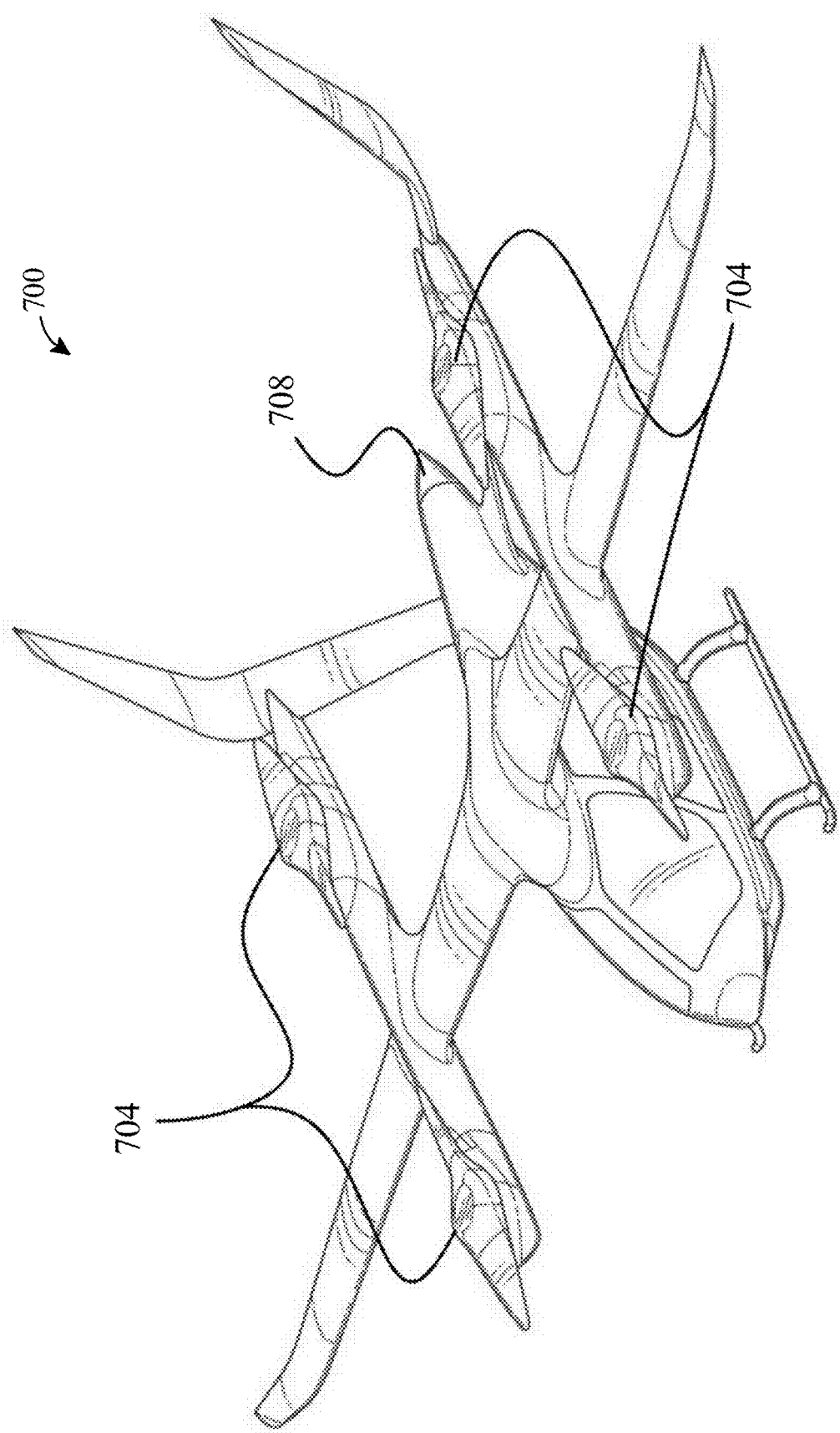
FIG. 7 is an illustration of an exemplary embodiment of an electric aircraft.

Referring now to FIG. 7, an embodiment of an electric aircraft 700 is presented. Still referring to FIG. 7, electric aircraft 700 may include a vertical takeoff and landing aircraft (eVTOL). As used herein, a vertical take-off and landing (eVTOL) aircraft may be one that can hover, take off, and land vertically. An eVTOL, as used herein, may be an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, may be where the aircraft generated lift and propulsion by way of one or more powered rotors connected with an engine, such as a "quad copter," multi-rotor helicopter, or other vehicle that maintains its lift primarily using downward thrusting propulsors. Fixed-wing flight, as described herein, may be where the aircraft may be capable of flight using wings and/or foils that generate life caused by the aircraft's forward airspeed and the shape of the wings and/or foils, such as airplane-style flight. Control forces of the aircraft are achieved by conventional elevators, ailerons and rudders during fixed wing flight. Roll and Pitch control forces on the aircraft are achieved during transition flight by increasing and decreasing torque, and thus thrust on the four lift fans. Increasing torque on both left motors and decreasing torque on both right motors leads to a right roll, for instance. Likewise, increasing the torque on the front motors and decreasing the torque on the rear motors leads to a nose up pitching moment. Clockwise and counterclockwise turning motors torques are increased and decreased to achieve the opposite torque on the overall aircraft about the vertical axis and achieve yaw maneuverability.

With continued reference to FIG. 7, a number of aerodynamic forces may act upon the electric aircraft 700 during flight. Forces acting on an electric aircraft 700 during flight may include, without limitation, thrust, the forward force produced by the rotating element of the electric aircraft 700 and acts parallel to the longitudinal axis. Another force acting upon electric aircraft 700 may be, without limitation, drag, which may be defined as a rearward retarding force which may be caused by disruption of airflow by any protruding surface of the electric aircraft 700 such as, without limitation, the wing, rotor, and fuselage. Drag may oppose thrust and acts rearward parallel to the relative wind. A further force acting upon electric aircraft 700 may include, without limitation, weight, which may include a combined load of the electric aircraft 700 itself, crew, baggage, and/or fuel. Weight may pull electric aircraft 700 downward due to the force of gravity. An additional force acting on electric aircraft 700 may include, without limitation, lift, which may act to oppose the downward force of weight and may be produced by the dynamic effect of air acting on the airfoil and/or downward thrust from the propulsor of the electric aircraft. Lift generated by the airfoil may depend on speed of airflow, density of air, total area of an airfoil and/or segment thereof, and/or an angle of attack between air and the airfoil. For example, and without limitation, electric aircraft 700 are designed to be as lightweight as possible. Reducing the weight of the aircraft and designing to reduce the number of components may be essential to optimize the weight. To save energy, it may be useful to reduce weight of components of an electric aircraft 700, including without limitation propulsors and/or propulsion assemblies. In an embodiment, the motor may eliminate need for many external structural features that otherwise might be needed to join one component to another component. The motor may also increase energy efficiency by enabling a lower physical propulsor profile, reducing drag and/or wind resistance. This may also increase durability by lessening the extent to which drag and/or wind resistance add to forces acting on electric aircraft 700 and/or propulsors.

Referring still to FIG. 7, aircraft may include at least a vertical propulsor 704 and at least a forward propulsor 708. A forward propulsor may be a propulsor that propels the aircraft in a forward direction. Forward in this context may be not an indication of the propulsor position on the aircraft; one or more propulsors mounted on the front, on the wings, at the rear, etc. A vertical propulsor may be a propulsor that propels the aircraft in an upward direction; one of more vertical propulsors may be mounted on the front, on the wings, at the rear, and/or any suitable location. A propulsor, as used herein, may be a component or device used to propel a craft by exerting force on a fluid medium, which may include a gaseous medium such as air or a liquid medium such as water. At least a vertical propulsor 704 may be a propulsor that generates a substantially downward thrust, tending to propel an aircraft in a vertical direction providing thrust for maneuvers such as without limitation, vertical take-off, vertical landing, hovering, and/or rotor-based flight such as "quadcopter" or similar styles of flight.

With continued reference to FIG. 7, at least a forward propulsor 708 as used in this disclosure may be a propulsor positioned for propelling an aircraft in a "forward" direction; at least a forward propulsor may include one or more propulsors mounted on the front, on the wings, at the rear, or a combination of any such positions. At least a forward propulsor may propel an aircraft forward for fixed-wing and/or "airplane"-style flight, takeoff, and/or landing, and/or may propel the aircraft forward or backward on the ground. At least a vertical propulsor 704 and at least a forward propulsor 708 includes a thrust element. At least a thrust element may include any device or component that converts the mechanical energy of a motor, for instance in the form of rotational motion of a shaft, into thrust in a fluid medium. At least a thrust element may include, without limitation, a device using moving or rotating foils, including without limitation one or more rotors, an airscrew or propeller, a set of airscrews or propellers such as contrarotating propellers, a moving or flapping wing, or the like. At least a thrust element may include without limitation a marine propeller or screw, an impeller, a turbine, a pump-jet, a paddle or paddle-based device, or the like. As another non-limiting example, at least a thrust element may include an eight-bladed pusher propeller, such as an eight-bladed propeller mounted behind the engine to ensure the drive shaft may be in compression. Propulsors may include at least a motor mechanically connected to at least a first propulsor as a source of thrust. A motor may include without limitation, any electric motor, where an electric motor may be a device that converts electrical energy into mechanical energy, for instance by causing a shaft to rotate. At least a motor may be driven by direct current (DC) electric power; for instance, at least a first motor may include a brushed DC at least a first motor, or the like. At least a first motor may be driven by electric power having varying or reversing voltage levels, such as alternating current (AC) power as produced by an alternating current generator and/or inverter, or otherwise varying power, such as produced by a switching power source. At least a first motor may include, without limitation, brushless DC electric motors, permanent magnet synchronous at least a first motor, switched reluctance motors, or induction motors. In addition to inverter and/or a switching power source, a circuit driving at least a first motor may include electronic speed controllers or other components for regulating motor speed, rotation direction, and/or dynamic braking. Persons skilled in the art, upon reviewing the entirety of this disclosure, will be aware of various devices that may be used as at least a thrust element.

With continued reference to FIG. 7, during flight, a number of forces may act upon the electric aircraft. Forces acting on an aircraft 700 during flight may include thrust, the forward force produced by the rotating element of the aircraft 700 and acts parallel to the longitudinal axis. Drag may be defined as a rearward retarding force which may be caused by disruption of airflow by any protruding surface of the aircraft 700 such as, without limitation, the wing, rotor, and fuselage. Drag may oppose thrust and acts rearward parallel to the relative wind. Another force acting on aircraft 700 may include weight, which may include a combined load of the aircraft 700 itself, crew, baggage and fuel. Weight may pull aircraft 700 downward due to the force of gravity. An additional force acting on aircraft 700 may include lift, which may act to oppose the downward force of weight and may be produced by the dynamic effect of air acting on the airfoil and/or downward thrust from at least a propulsor. Lift generated by the airfoil may depends on speed of airflow, density of air, total area of an airfoil and/or segment thereof, and/or an angle of attack between air and the airfoil.

With continued reference to FIG. 7, at least a portion of an electric aircraft may include at least a propulsor. A propulsor, as used herein, may be a component or device used to propel a craft by exerting force on a fluid medium, which may include a gaseous medium such as air or a liquid medium such as water. In an embodiment, when a propulsor twists and pulls air behind it, it will, at the same time, push an aircraft forward with an equal amount of force. The more air pulled behind an aircraft, the greater the force with which the aircraft may be pushed forward. Propulsor may include any device or component that consumes electrical power on demand to propel an electric aircraft in a direction or other vehicle while on ground or in-flight.

With continued reference to FIG. 7, in an embodiment, at least a portion of the aircraft may include a propulsor, the propulsor may include a propeller, a blade, or any combination of the two. The function of a propeller may be to convert rotary motion from an engine or other power source into a swirling slipstream which pushes the propeller forwards or backwards. Propulsor may include a rotating power-driven hub, to which are attached several radial airfoil-section blades such that the whole assembly rotates about a longitudinal axis. The blade pitch of the propellers may, for example, be fixed, manually variable to a few set positions, automatically variable (e.g. a "constant-speed" type), or any combination thereof. In an embodiment, propellers for an aircraft are designed to be fixed to their hub at an angle similar to the thread on a screw makes an angle to the shaft; this angle may be referred to as a pitch or pitch angle which will determine the speed of the forward movement as the blade rotates.

With continued reference to FIG. 7, in an embodiment, a propulsor can include a thrust element which may be integrated into the propulsor. Thrust element may include, without limitation, a device using moving or rotating foils, such as one or more rotors, an airscrew or propeller, a set of airscrews or propellers such as contra-rotating propellers, a moving or flapping wing, or the like. Further, a thrust element, for example, can include without limitation a marine propeller or screw, an impeller, a turbine, a pump-jet, a paddle or paddle-based device, or the like.

With continued reference to FIG. 7, control surfaces may each include any portion of an aircraft that can be moved or adjusted to affect altitude, airspeed velocity, groundspeed velocity or direction during flight. For example, control surfaces may include a component used to affect the aircrafts' roll and pitch which may include one or more ailerons, defined herein as hinged surfaces which form part of the trailing edge of each wing in a fixed wing aircraft, and which may be moved via mechanical means such as without limitation servomotors, mechanical linkages, or the like, to name a few. As a further example, control surfaces may include a rudder, which may include, without limitation, a segmented rudder. Rudder may function, without limitation, to control yaw of an aircraft. Also, control surfaces may include other flight control surfaces such as propulsors, rotating flight controls, or any other structural features which can adjust the movement of the aircraft. A "control surface" as described herein, is any form of a mechanical linkage with a surface area that interacts with forces to move an aircraft. A control surface may include, as a non-limiting example, ailerons, flaps, leading edge flaps, rudders, elevators, spoilers, slats, blades, stabilizers, stabilators, airfoils, a combination thereof, or any other mechanical surface are used to control an aircraft in a fluid medium. Persons skilled in the art, upon reviewing the entirety of this disclosure, will be aware of various mechanical linkages that may be used as a control surface, as used and described in this disclosure.

With continued reference to FIG. 7, aircraft 700 trajectory is manipulated by one or more control surfaces and propulsors working alone or in tandem consistent with the entirety of this disclosure, hereinbelow. Pitch, roll, and yaw may be used to describe an aircraft's attitude and/or heading, as they correspond to three separate and distinct axes about which the aircraft may rotate with an applied moment, torque, and/or other force applied to at least a portion of an aircraft. "Pitch", for the purposes of this disclosure refers to an aircraft's angle of attack, that is the difference between the aircraft's nose and the horizontal flight trajectory. For example, an aircraft pitches "up" when its nose is angled upward compared to horizontal flight, like in a climb maneuver. In another example, the aircraft pitches "down", when its nose is angled downward compared to horizontal flight, like in a dive maneuver. When angle of attack is not an acceptable input to any system disclosed herein, proxies may be used such as pilot controls, remote controls, or sensor levels, such as true airspeed sensors, pitot tubes, pneumatic/hydraulic sensors, and the like. "Roll" for the purposes of this disclosure, refers to an aircraft's position about its longitudinal axis, that is to say that when an aircraft rotates about its axis from its tail to its nose, and one side rolls upward, like in a banking maneuver. "Yaw", for the purposes of this disclosure, refers to an aircraft's turn angle, when an aircraft rotates about an imaginary vertical axis intersecting the center of the earth and the fuselage of the aircraft. "Throttle", for the purposes of this disclosure, refers to an aircraft outputting an amount of thrust from a propulsor. Pilot input, when referring to throttle, may refer to a pilot's desire to increase or decrease thrust produced by at least a propulsor. More than one propulsor may be required to adjust torques to accomplish the command to change pitch and yaw, mixer would take in the command and allocate those torques to the appropriate propulsors consistent with the entirety of this disclosure. One of ordinary skill in the art, after reading the entirety of this disclosure, will appreciate the limitless combination of propulsors, flight components, control surfaces, or combinations thereof that could be used in tandem to generate some amount of authority in pitch, roll, yaw, and lift of an electric aircraft consistent with this disclosure.

With continued reference to FIG. 7, "flight components", for the purposes of this disclosure, includes components related to, and mechanically connected to an aircraft that manipulates a fluid medium in order to propel and maneuver the aircraft through the fluid medium. The operation of the aircraft through the fluid medium will be discussed at greater length hereinbelow. At least an input datum may include information gathered by one or more sensors. In non-limiting embodiments, flight components may include propulsors, wings, rotors, propellers, pusher propellers, ailerons, elevators, stabilizers, stabilators, and the like, among others.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
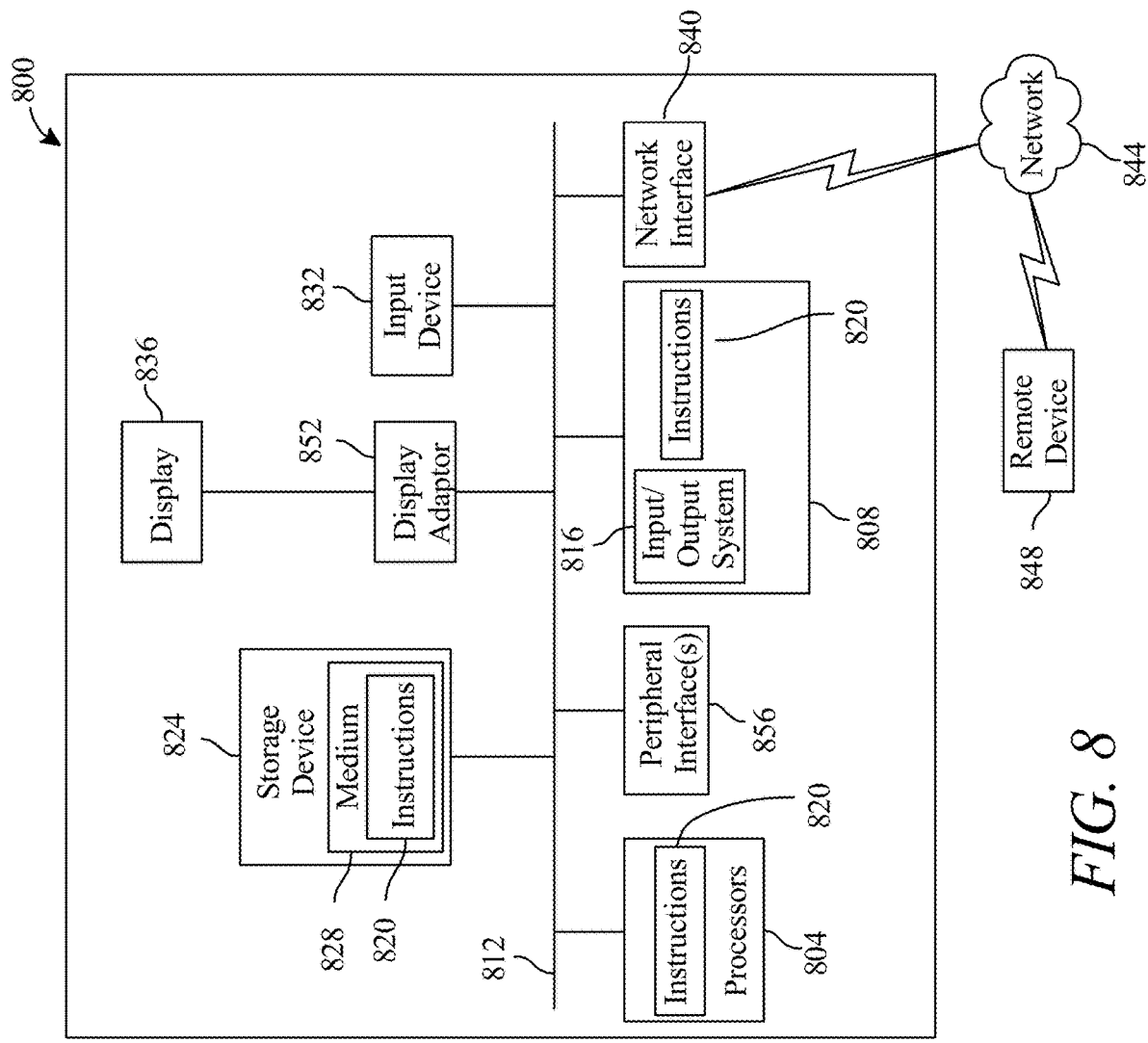
FIG. 8 is a block diagram of a computing system that can be used to implement any one or more of the methodologies disclosed herein and any one or more portions thereof.

FIG. 8 shows a diagrammatic representation of one embodiment of a computing device in the exemplary form of a computer system 800 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Processor 804 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 804 may be organized according to Von Neumann and/or Harvard architecture as a non-limiting example. Processor 804 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 808 may include various components (e.g., machine-readable media) including, but not limited to, a random-access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A system for state determination of a battery module configured for use in an electric aircraft, the system comprising:
    at least a battery module, the at least a battery module comprising at least a battery cell;
    at least a sensor, wherein the at least a sensor includes a proximity sensor configured to detect a status datum corresponding to the at least a battery module;
    a processor, the processor configured to:
        receive the status datum from the at least a sensor;
        generate, utilizing a machine-learning process, a charge datum as a function of the status datum corresponding to the at least a battery module;
        compare the charge datum to a calculated charge datum including health datum threshold;
        generate, utilizing the machine-learning process, a health datum as a function of the status datum corresponding to the at least a battery module;
        transmit the charge datum and the health datum; and
    a display, the display configured to:
        receive the charge datum and the health datum corresponding to the at least a battery cell; and
        display the charge datum and the health datum corresponding to the at least a battery cell.

2. The system of claim 1, wherein the health datum comprises a useful life estimate corresponding to the at least a battery module.

3. The system of claim 1, wherein the at least a sensor comprises a sensor suite, the sensor suite configured to capture a plurality of data.

4. The system of claim 1, wherein the at least a sensor includes a pressure sensor.

5. The system of claim 1, wherein the at least a battery module comprises a module strap disposed on a first endplate and a second endplate configured to secure the first end plate and the second end plate.

6. The system of claim 1, wherein the at least a battery module comprises a first endplate disposed at a first end and a second endplate disposed at a second end.

7. The system of claim 1, wherein the at least a battery module comprises a compression alignment guide disposed between adjacent compression elements.

8. The system of claim 1, wherein comparing the charge datum to a calculated charge datum further comprises using a voting module to verify whether the charge datum is within an expected range.

9. The system of claim 2, wherein the useful life estimate corresponding to the at least a battery module is displayed by the display.

10. The system of claim 3, wherein the processor is configured to select a datum of the plurality of data and utilize the datum to determine the health datum.

11. A method for state determination of a battery module configured for use in an electric aircraft, the method comprising:
    detecting, by a processor and using at an at least a sensor, a status datum corresponding to at least a battery module;
    receiving, at the processor, the status datum corresponding to at least a battery module;
    generating, at the processor utilizing a machine-learning process, a charge datum as a function of the status datum corresponding to the at least a battery module;
    comparing, at the processor, the charge datum to a calculated charge datum including health datum threshold;
    generating, at the processor, utilizing the machine-learning process, a health datum as a function of the status datum corresponding to the at least a battery module;
    receiving, at a pilot display, the charge datum and the health datum; and
    displaying, at the pilot display, the charge datum and the health datum.

12. The method of claim 11, wherein the health datum comprises a useful life estimate corresponding to the at least a battery module.

13. The method of claim 11, wherein the at least a sensor comprises a sensor suite.

14. The method of claim 11, wherein the at least a sensor comprises a pressure sensor.

15. The method of claim 11, wherein the at least a battery module comprises a module strap disposed on a first endplate and a second endplate configured to secure the first end plate and the second end plate.

16. The method of claim 11, wherein the at least a battery module comprises a first endplate disposed at a first end and a second endplate disposed at a second end.

17. The method of claim 11, wherein the at least a battery module comprises a compression alignment guide disposed between adjacent compression elements.

18. The method of claim 11, wherein comparing the charge datum to a calculated charge datum further comprises using a voting module to verify whether the charge datum is within an expected range.

19. The method of claim 12, wherein the useful life estimate corresponding to the at least a battery module is displayed by the pilot display.

20. The method of claim 13, wherein the processor is configured to select a datum of a plurality of data and utilize the datum to determine the charge datum and the health datum.

* * * * *